United States Patent [19]

Nablo et al.

[11] Patent Number: 5,635,714
[45] Date of Patent: Jun. 3, 1997

[54] DATA REDUCTION SYSTEM FOR REAL TIME MONITORING OF RADIATION MACHINERY

[75] Inventors: Samuel V. Nablo, Lexington; David R. Kneeland, Manchester, both of Mass.

[73] Assignee: Trygon, Inc., Manchester, Mass.

[21] Appl. No.: 558,198

[22] Filed: Nov. 16, 1995

Related U.S. Application Data

[63] Continuation-in-part of Ser. No. 210,952, Mar. 21, 1994, abandoned.

[51] Int. Cl.$^6$ .................................................. H01J 49/44
[52] U.S. Cl. .................... 250/305; 250/492.3; 250/492.1
[58] Field of Search .............................. 250/305, 306, 250/307, 310, 311, 492.1, 492.3, 397, 399, 336.1, 370.01, 370.07, 370.09, 371; 378/88, 89, 97, 138, 140, 156

[56] References Cited

U.S. PATENT DOCUMENTS

| | | | |
|---|---|---|---|
| 3,838,284 | 9/1974 | McIntyre et al. | 250/385 |
| 4,059,763 | 11/1977 | Heighway et al. | 250/336 |
| 4,347,547 | 8/1982 | Gibson | 361/187 |
| 4,652,763 | 3/1987 | Nablo | 250/492.3 |
| 4,877,961 | 10/1989 | McIntyre et al. | 250/397 |
| 4,887,604 | 12/1989 | Shefer et al. | 128/654 |
| 5,115,459 | 5/1992 | Bertozzi | 378/88 |
| 5,326,970 | 7/1994 | Bayless | 250/269 |
| 5,495,106 | 2/1996 | Mastny | 250/253 |

OTHER PUBLICATIONS

Radiat. Phys. Chem. vol. 18. No. 5–6, pp. 1023–1039, 1981: Nablo, et al; "Techniques for the Diagnosis of Industrial Electron Processor Performance" no month.

Radiation Curing in Polymer Science and Technology vol. I; Fouassier et al. "Fundamentals and Methos" pp. 550–554, 1993 no month.

Proceedings of the second International Kilmer Memorial Conference on the Sterilization of Medical Products Oct. 16 and 17, 1980 pp. 219–220; Nablo.

*Primary Examiner*—Jack I. Berman
*Assistant Examiner*—Kiet T. Nguyen
*Attorney, Agent, or Firm*—Nields & Lemack

[57] ABSTRACT

A data reduction system for real time monitoring of radiation machinery measures the bremsstrahlung flux produced by the electron beam used to generate the desired radiation, and then corrects the measurement by corrective signals derived from the determination of other parameters, such as the energy of the electrons, the velocity of the product irradiated, the temperature of the device which measures the flux, and differences in sensitivity between a plurality of devices which measure the spacial and temporal distribution of the flux.

22 Claims, 15 Drawing Sheets

DATA REDUCTION SYSTEM FOR REAL TIME MONITORING OF RADIATION MACHINERY

This application is a continuation-in-part of U.S. Ser. No. 08/210,592 filed Mar. 21, 1994, now abandoned.

BACKGROUND OF THE INVENTION

1. Field of the Invention

This invention relates to real time monitoring of radiation machinery, such as electron beam processors for industrial use.

2. Description of the Prior Art

X-ray monitors

There are numerous techniques used to monitor radiation producing equipment, largely developed for the accurate measurement of the radiation fields generated by x-ray equipment for medical applications. These range from mosaic detectors as used in computer assisted tomographic (CAT) scanners to large screen displays for radiation therapy planning and monitoring. All of these tools depend upon the detection of penetrating (10–1,000 KeV) photons in air, but none have been available for the direct diagnosis of the electron beam itself which generates the x-ray or photon distribution through the bombardment in vacuum of high Z metal targets, and through treatment in gas, at atmospheric pressure, of the product itself.

Direct Electron Processors

Over the past two decades, a large number of direct electron beam processors have been developed for industrial use. These range from the "spot beam" high voltage accelerators, such as the Dynamitron® type (manufactured by Radiation Dynamics Inc., Melville, N.Y.) to the large area, "distributed beam" low voltage accelerators, for example of the Electrocurtain® type (manufactured by Energy Sciences Inc., Wilmington, Mass.).

Electron window

Unlike an x-ray generator, these processors utilize an accelerator vacuum housing in which the accelerated electrons can be delivered directly to product located outside the vacuum housing in a controlled environment usually at standard temperature and pressure (STP). This is normally accomplished by replacing the x-ray producing heavy metal target (i.e. the anode) with an electron permeable window. These windows are typically made up of thin metallic foils (e.g. Titanium) offering high strength at elevated temperatures and sufficiently thin that modest (e.g. <20%) electron energy loss occurs in transmission.

Window support structure

Since the power densities of the electron beams from these processors are very high at the window or anode planes (150 w/cm$^2$), the windows must incorporate suitable heat dissipation techniques—usually conduction cooling of the metallic foil via support frames with water channels, or forced air convection cooling of the window foils. For electron processors below 300 KV, where cooling is particularly demanding, water cooling is mandatory for large area equipment. It is always employed in industrial units, either in the form of finned or drilled plates or honeycomb support frames with peripheral water cooling. The design of these window structures must optimize electron transmission because any electrons stopped or lost in the window represent a "full energy" loss; that is, the electrons at this (anode) plane have a full energy investment from the processor. The goal is to effect the maximum transfer of the kinetic energy carried by the accelerated beam into absorbed energy or dose in the target or product located on the exterior side of the window. Nevertheless, for high power processors, the energy losses in the window can be very large—typically ranging from 20% in the foil and 20% in the support frame for low energy processors (e.g. 150 KV), to 1.5% in the foil and nothing in the frame for scanned high energy processors (e.g. 2000 KV).

Thin film dosimeters

Most of the standard dosimetric techniques which have been developed (such as those described at McLaughlin, W. L., Humphreys, J. C., Hocken, D. and Chappas, W. I, "Radiochromic Dosimetry for Validation and Commissioning of Industrial Radiation Processes", Radiat. Phys. Chem. 31, #4–6, 505, (1988)) for penetrating radiation (x-rays and gamma-rays) cannot be applied in the industrial application of this machinery, due to the modest penetration capabilities of the electron energies used in practical process applications (0.1–2.0 MeV). Consequently, film dosimeters have been developed with thicknesses far less than the depth of penetration of a 100 KeV electron (typically 10–50 g/cm$^2$). This dosimeter thickness feature is essential for accurate diagnosis of the electron spectra delivered by the machines because it is desirable to have dosimeter thicknesses some 5–10% of the range of the electrons being diagnosed, particularly for spectral evaluation. In this application, one uses depth-dose laminates to determine the effective penetration profile of the spectra in matter. This technique is widely employed for spectral quality verification in operating processors, and although laborious in practice, can provide spectral energy determinations accurate to within a few percent (e.g. ±1%).

Parameters requiring monitoring

In the application of electron beam machinery for industrial processing (as described for example at Nablo, S. V., "Electron Beam Processing Machinery", Ch.9, *Radiation Curing in Polymer Science and Technology*, ed. J. P. Fouassier and J. F. Rabek, Elsevier Applied Science, London (1993)), it is necessary to monitor the three critical operating parameters: machine yield, uniformity, and energy.

Yield

The first of these, yield k has units of Mrad*meters per min.*ma for a given machine, and relates machine output current I, and product speed v, to delivered dose D; i.e. D=kI/v. This yield parameter should be invariant with current if the electron optics of the system are well designed, but it will vary with electron energy or accelerator voltage because the electron stopping power in the product or in the dosimeter varies with energy. A typical yield variation with accelerator voltage (electron energy incident on the window) is shown in FIG. 8. The lower energy ends of these curves are dominated by window foil absorption while the fall-off at higher energies arises from the decrease in electron stopping power with increasing energy in all materials.

Sampling rate

The yield sampling rate will vary with the tolerance of the product for dose variation. For example, in electron sterilization of medical devices, yield data will be recorded and evaluated several times daily, before the process can be continued. This is mandatory even with continuous recording of other process parameters such as voltage, current, and conveyor speed.

Current measurement

One of the primary reasons for the development of the device disclosed here is the need to continuously monitor the electron beam reaching the window in order to verify the current indication given by the power supply itself. The indeterminate nature of the power supply return current as a measure of the actual beam current is depicted schematically in FIG. 9. Here the presence of gas molecules in the beam occupied region leads to a backstreaming ion current to the gun or high voltage terminal of the accelerator. The arrival of these positively charged ions is recorded by the ammeter I in the high voltage power supply circuit as electrons leaving, so their presence leads to errors in the measurement of the accelerated electron current (as described in more detail at Nablo, S. V., "Progress Toward Practical Electron Beam Sterilization", pp. 210–221 *Sterilization of Medical Products*, ed. E. R. L. Gaughran and R. F. Morrissey, Multiscience Publications Ltd., Montreal, Quebec (1981)). While these errors are insignificant at normal residual gas pressures in the accelerator (e.g. $10^{-6}$ mm Hg.) they can become large with a localized concentration of $N_2$ and $O_2$ introduced by pin-holes or leaks in the electron permeable window foil. The deterioration of a window foil on a 2 meter industrial processor foil as it approached failure is documented in FIG. 10 and this phenomenon has been reproduced under controlled conditions via gas injection in a working processor at the window plane. Furthermore, this problem and its consequences are exacerbated by the "trapping" of ions in the electron beam occupied region of the processor, so that significant gas density can build up due to pin-hole effects without affecting the ionization gauge or gas analyzer monitoring the residual gas pressure in the vacuum envelope of the accelerator.

Magnetic fields

An additional operational problem which can affect the performance of the processor is that due to the presence of time varying external magnetic fields which can distort the electron optics. The electron "rigidity" in these machines can vary greatly from, for example, an Hρ value of 34 gauss-cm for 100 eV electrons in the triode region of the gun, to an Hρ value of 2120 gauss-cm for 300 KeV electrons fully accelerated at the window plane. Stray fields from dc motors, overhead cranes or from the equipment on which the processor is mounted, can easily affect the electromagnetically unshielded low energy beam so that significant electron optical deterioration occurs; i.e. fewer of the accelerated electrons reach the window and are absorbed in the chamber wall instead. A demonstration of this is shown in FIG. 11, recorded with a 30 cm sterilizer in which the original uniformity profile is plotted, and then the profile with a permanent magnet generating a 3 gauss field orthogonal to the beam in the accelerator gap. As shown, a significant depression of the beam yield on the centerline resulted (−15%) while the Lorentz forces (j×B) on the beam led to a pile-up of the current density at the ends of the window. Tests have shown that very large yield errors (50%) can be introduced into these processors with relatively modest field strengths of appropriate orientation; e.g. 5 gauss fields perpendicular to the beam's direction of motion. This sensitivity is the result of the magnetically unshielded optics of these processors because of the non-ferromagnetic stainless steels used in their fabrication.

Invasive dosimetry

A final operational problem in the monitoring of electron processing is the "invasive" nature of dosimetry. One wishes to monitor the processor performance (as described for example at Nablo, S. V. and Frutiger, W. A., "Techniques for the Diagnosis of Industrial Electron Processor Performance", Rad. Phys. Chem 18, #5–6, 1023 (1981)) under actual production conditions. These may be at high processor power levels and, typically, high line speeds, (say 200 meters/minute). It is impractical to perform dosimetry "on the fly" at these speeds, so that dosimetric mapping must be performed by interruption of the product flow and slowing of the line speed. For example, in the curing of inks on paperboard, a dosimetric array is carried through the "non-printing system", usually at reduced line speeds and hence operational current levels.

Dosimeter range

In addition, there are high dose applications in which doses are given which are well outside the linear range of the film dosimeters; i.e. above 5 to 50 kGys. Here, measurements must be made at other than actual production conditions, and simple current or speed scaling used to confirm the actual production dose. For sterilization applications the dosimeter absorption problems are even more severe, especially where controlled depth of penetration is important. The additional thicknesses of the dosimeter and its carrier are intolerable because they reduce the dose delivered to the product, and the dosimeters must be mounted on an exemplar which can be handled by the conveyor in a manner identical to that in which the actual product is transported.

Need for Real Time monitor

All of these considerations have stimulated the search for a simple, non-invasive technique which permits processor monitoring in real time. It is necessary that the technique be traceable to a national standard. For example, in the United States the thin film dosimeters are traceable to (calibrated by) a standard Cobalt 60 source at the National Institute of Standards and Technology in Gaithersburg, Md., and any real time radiation monitor used for these machines must be traceable to similar national standards worldwide.

Cross web Uniformity and Energy

Many of the "yield" measurement problems reviewed above are common to the measurement of both cross web uniformity of the beam and of beam energy. Both determinations require invasive dosimetry, and the difficulties of handling large dosimeter arrays at elevated speeds for the cross-web measurement of uniformity requires skilled technique and prolonged interruption of production. This labor intensive procedure is rarely performed unless required for "regulated application" such as sterilization, in spite of the need of most processes for good edge-to-edge treatment uniformity. The same is true of the dosimetric depth-dose technique used for electron energy determination, in spite of the great sensitivity of many critical sterilization or polymerization processes to small changes in electron energy; i.e. depth of penetration.

Machine voltage measurement

Dependence upon machine voltage monitoring is unreliable over the long term. The major error mechanism here is the change in resistance in the high voltage resistive divider string. This is usually made up of a large number of precision high voltage resistors of the deposited film type; e.g. $10^7$–$10^8$ ohms. Such resistors are subject to aging and spark damage. In summary then, the quality assurance of all in-line radiation processing would benefit from a real time monitor which is free of the problems just enumerated.

References

The following publications indicate the background of the invention and illustrate the state of the art; they are hereby incorporated herein by this reference thereto.

References with respect to solid state radiation detectors include Knoll, G. F., *Radiation Detection and Measurement*, John Wiley & Sons, Inc., 2nd Edition (1989), Chapter 11, Semiconductor Diode Detectors, pp. 337–386.

References with respect to speed measurement using generating tachometers include Pallas-Areny, R. and Webster, J. G., *Sensors and Signal Conditioning*, John Wiley & Sons, Inc. (1991), 4.3.1.1 Generating tachometers, pp. 182.

References with respect to the use of look-up tables for calibrating instruments, as an alternative to formulae, in microprocessor based instruments include Pallas-Areny, R. and Webster, J. G., *Sensors and Signal Conditioning*, John Wiley & Sons, Inc. (1991), 1.4.2 Other Characteristics: Linearity and Resolution, pp. 13, 14.

References with respect to x-ray kV measurement using filtered and non-filtered detectors include 1990–1991 *Catalog*, pg. 18, Non-Invasive kVp Divider, Keithley Radiation Measurements Division, Keithley Instruments, Inc., Cleveland, Ohio.

References with respect to PC data acquisition include *The Handbook of Personal Computer Data Acquisition*, 7th Edition, Section 7, Data Acquisition Tutorial, Intelligent Instrumentation, Inc., Tucson Ariz. (1994).

References with respect to electron beam processors include McLaughlin, W. L., Boyd, A. W., Chadwick, K. H., McDonald, J. C., and Miller, A., *Dosimetery for Radiation Processing*, Taylor and Francis, (1989), 2.3 Accelerator sources, pg. 44 et seq.

References with respect to electron beam processing included the following:

"Food Irradiation in Developing Countries: A Practical Alternative", Loaharanu, Paisan, IAEA Bulletin 1, 30–35, (1994), IAEA, P. O. Box 100, A-1400, Vienna, Austria.

Radiation Sterilization, Session IV, pp. 207–291, *Sterilization of Medical Products*, Proc. of Int'l. Kilmer conf., Vol. VI, ed. R. F. Morrissey, Brussels, Belgium, (1993); Polyscience Publications Inc., Morin Heights, Canada.

Nablo, S. V., "Electron Beam Processing Machinery", Ch. 9, pp. 503–554, *Radiation Curing in Polymer Science and Technology*, ed. J. P. Fouassier and J. F. Rabek, Elsevier Applied Science, London (1993).

Miller, A., "Status of Radiation Processing Dosimetry", Radiat. Phys. Chem. 42, 4–6, pp. 731–738, (1993).

PRINCIPLE OF OPERATION

Any device which is capable of measuring electron flux directly is subject to interfering effects which are difficult to correct in practical surroundings. For example, intercepting Faraday cups in vacuo not only "invade" the beam but are also subject to complicating photoelectric and Compton effects induced by the intense x-ray flux from the window. This type of backscattered electron detector pair has been used successfully in vacuo in scanned accelerators for beam centering, but has not been adapted to real time flux monitoring.

The use of fixed or moveable current probes similar to a shielded Langmuir probe (as described for example at Chen, F. F., "Electric Probes", Ch. 4, Plasma Diagnostic Techniques, ed. R. H. Huddlestone and S. L. Leonard, Academic Press, NY (1965)) as used in plasma diagnostics, has been considered in the monitoring of electron processors. The difficulties in their use in the process zone, that is, at atmospheric pressure of the ambient air or $N_2$, arise from the variable conditions in this region. For example, the x-ray flux is dependent upon beam current and voltage as well as the product, while the plasma density is affected by product speed, $N_2$ or inerting gas flow velocity and beam current density . . . too many variables to permit a reliable, direct probing of the electron beam which is amenable to calibration.

It has been proposed to utilize the direct monitoring of the x-rays generated by the primary electron beam in the window and its supporting structure. One such proposal is disclosed, for example, at page 1027 of aforementioned article by Nablo and Frutiger entitled "Techniques for the Diagnosis of Industrial Electron Processor Performance". However, the aforementioned proposals have not disclosed any details regarding the problems of correlating measurements derived from such x-rays with the desired information regarding electron-delivered dose rate and dose.

SUMMARY OF THE INVENTION

To circumvent the aforementioned problems, the real time monitoring system of the present invention comprehends measurement of the bremsstrahlung x-ray flux generated at the foil supporting window frame in the processor, and correction of that measurement by means of signals derived from the determination of other parameters, such as electron energy and the temperature or sensitivity of the flux-measuring apparatus. As used in this specification and claims, and in accordance with customary usage in this field of technology, the term "flux" has the same meaning as "dose rate" and the term "dose" has the same meaning as "fluence".

BRIEF DESCRIPTION OF THE DRAWINGS

The invention may best be understood from the following detailed description thereof, having reference to the accompanying drawings, in which.

Figure 16:
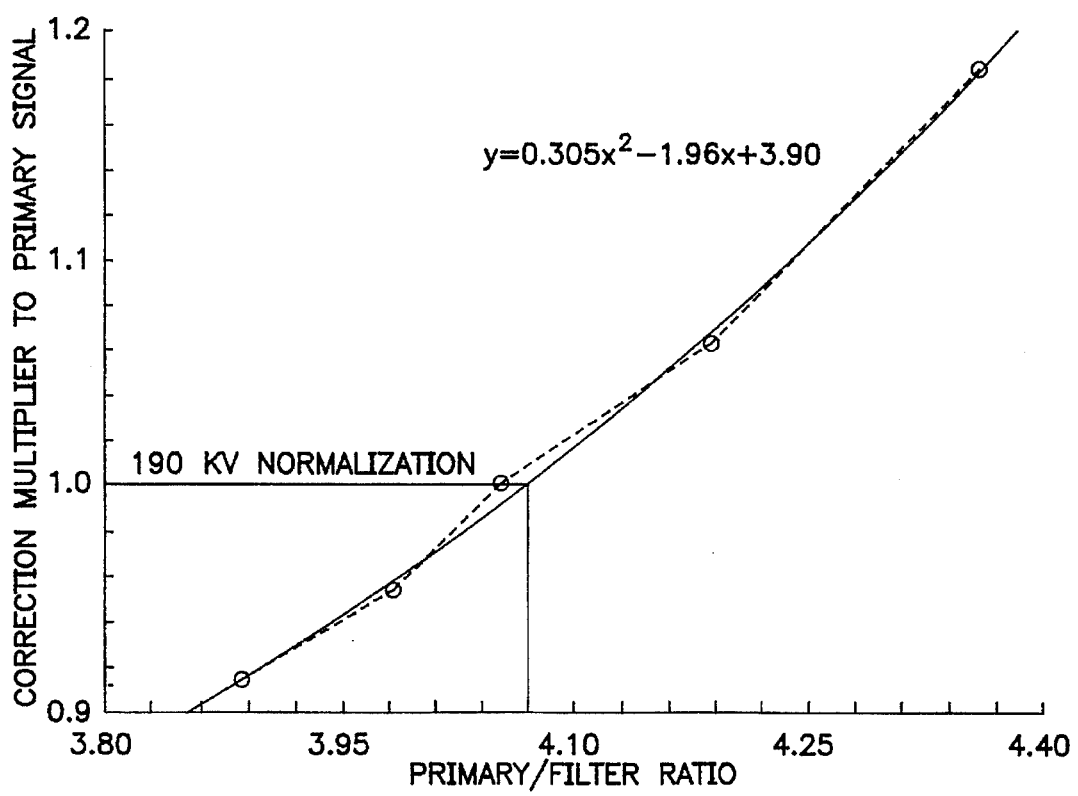
Figure 17:
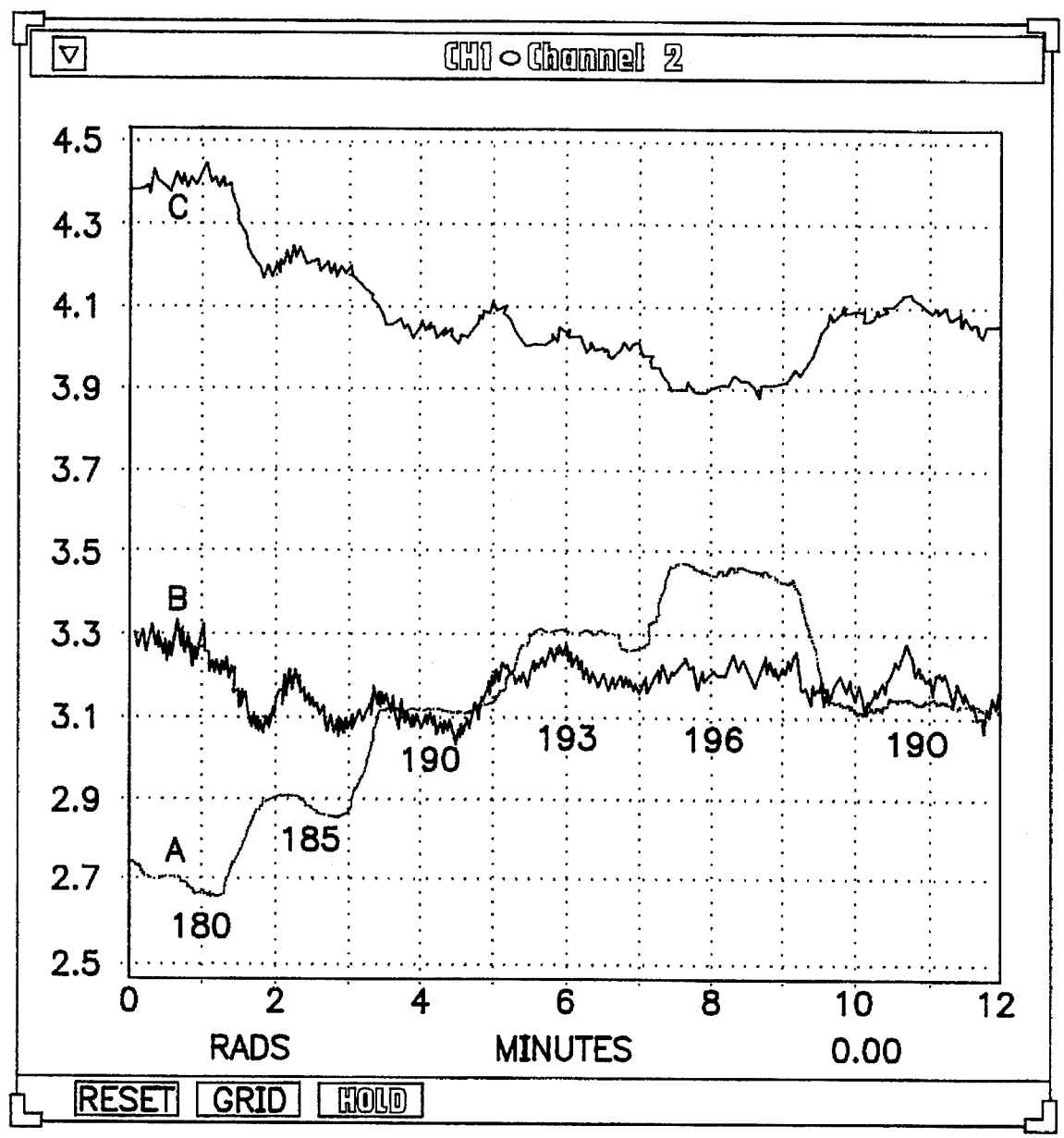
Figure 18:
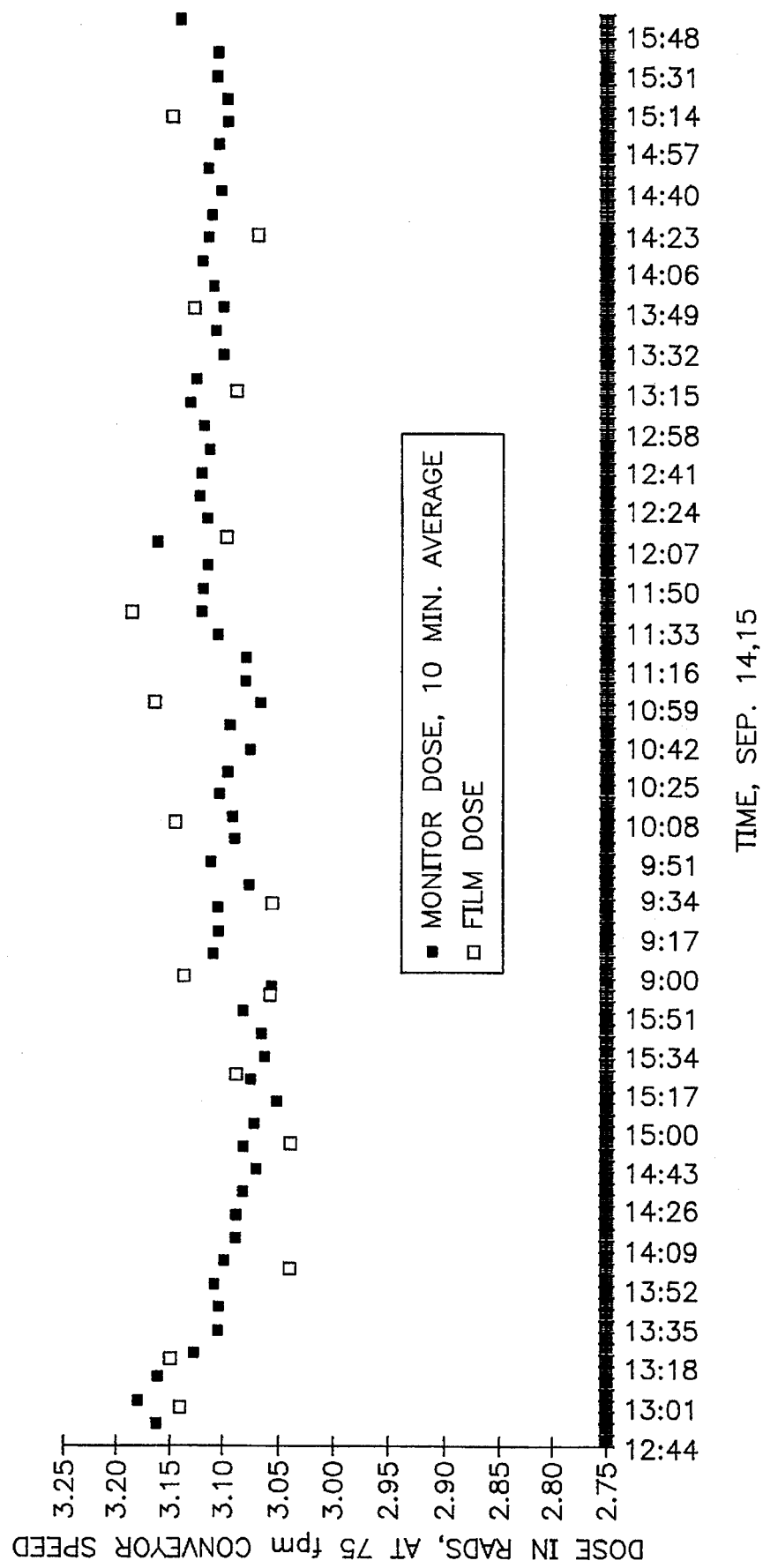

measured by the primary detector as a function of voltage; curve B shows the variation of the quotient of the signal current measured by the primary detector divided by the signal current measured by the filtered detector as a function of voltage;

FIG. 16 is a graph showing correction factors for primary signal over the voltage range 180 to 196 KV;

FIG. 17 shows raw and corrected detector output data over the 180–196 kV range;

FIG. 18 shows monitor data over 13 hours compared with thin film dosimetry; and

Figure 11:
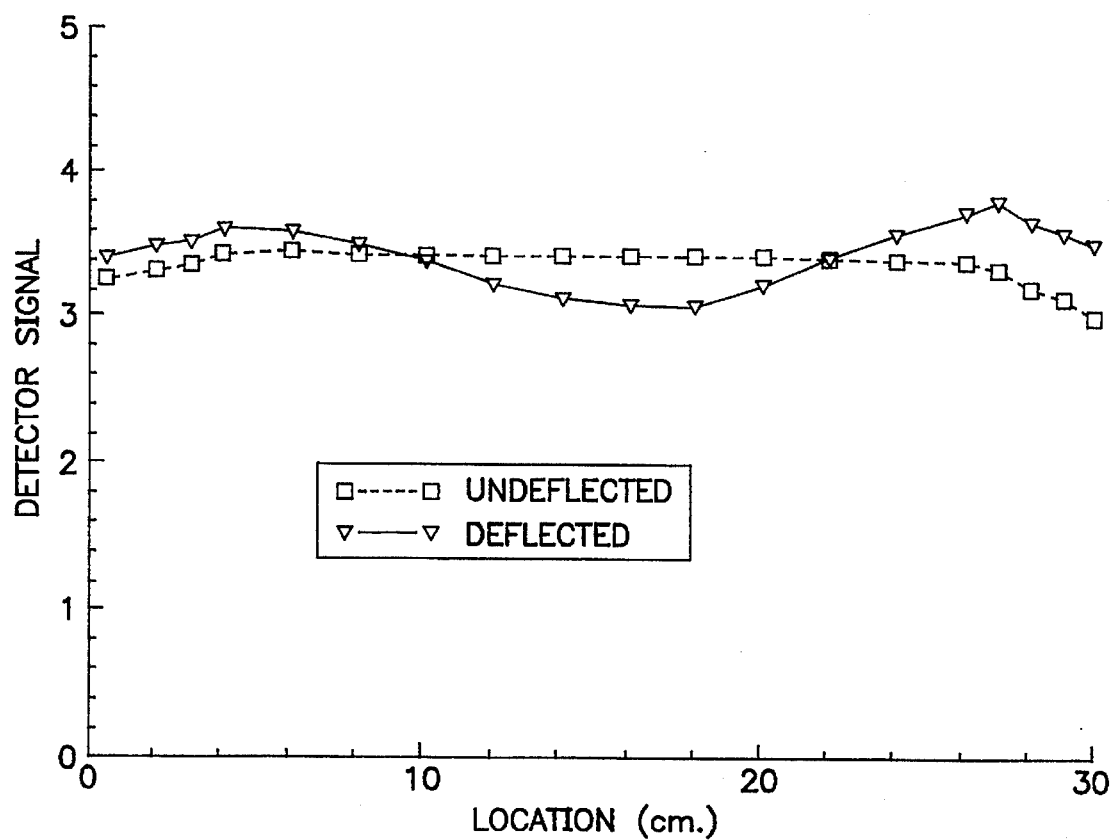
FIG. 11 is a graph showing uniformity disturbance by a magnetic field.
Figure 19:
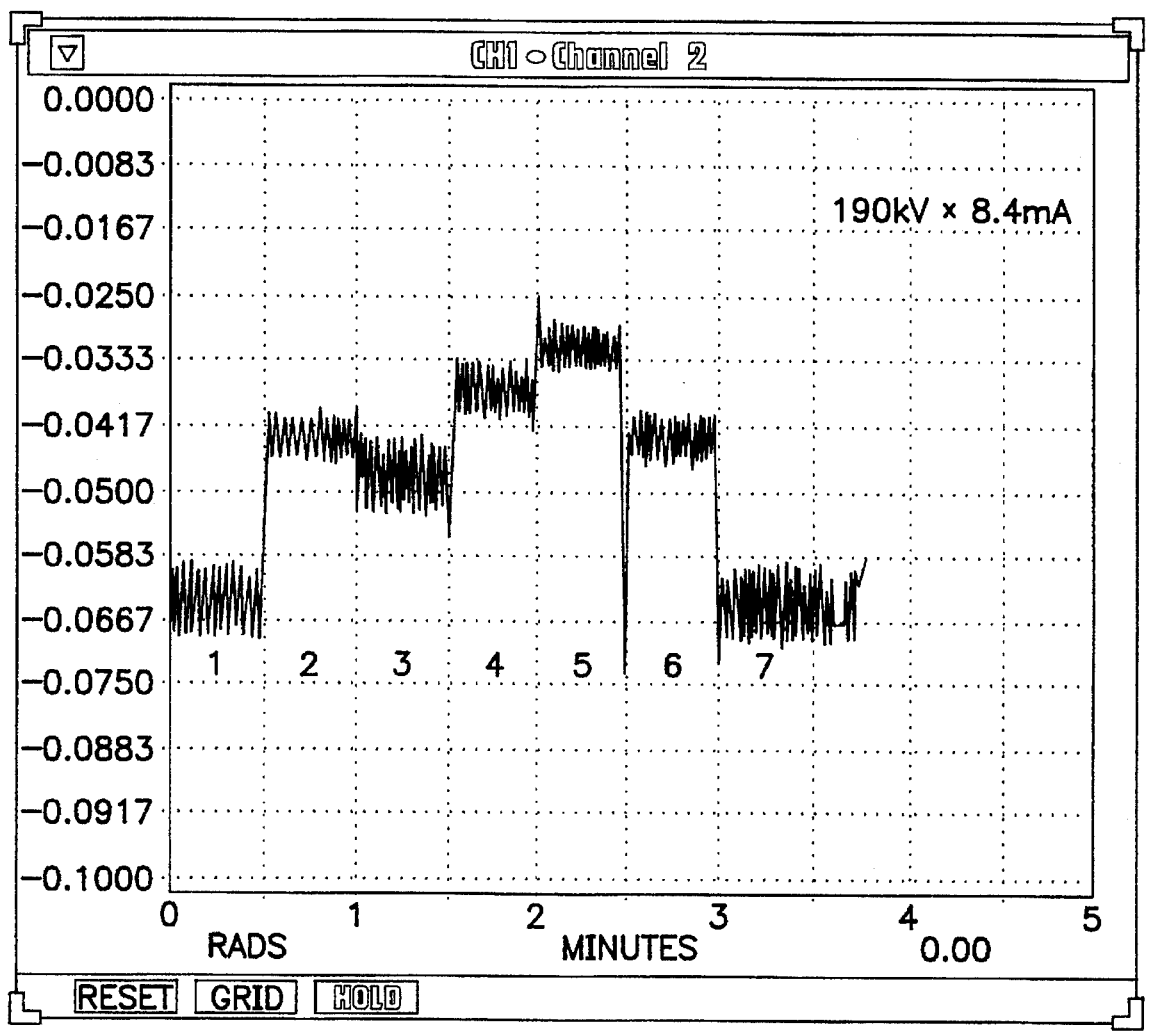

FIG. 19 is a demonstration of single channel centerline sensitivity to the distorted beam of FIG. 11.

DESCRIPTION OF THE PREFERRED EMBODIMENT

Figure 1:
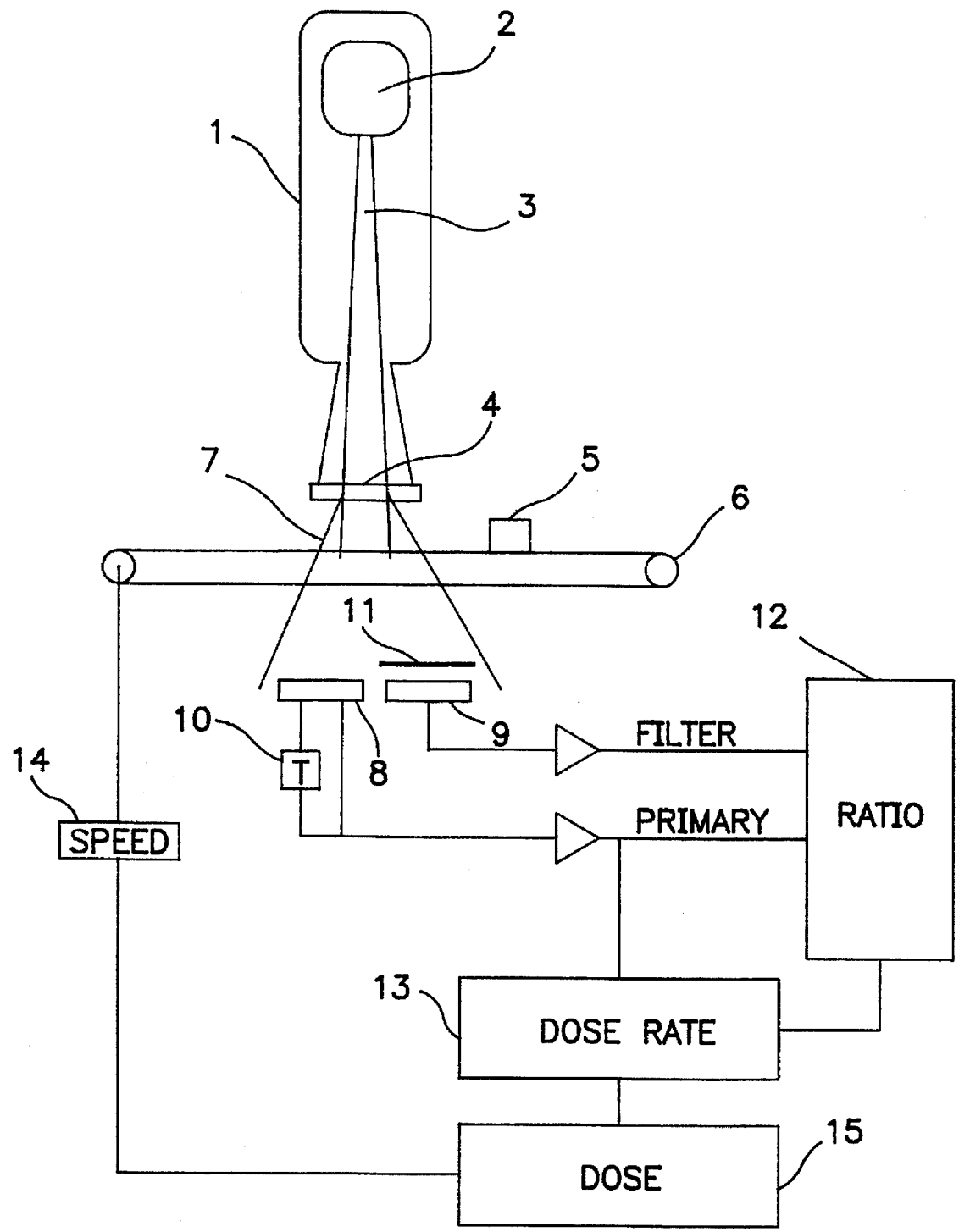
FIG. 1 is a somewhat diagrammatic view in vertical central section of an electron beam processor together with components used in connection therewith to carry out the method of the invention.

Referring to the drawings, and first to FIG. 1 thereof, therein is shown an electron beam processor 1 including a high voltage terminal 2 by means of which electrons are accelerated as an electron beam 3 in a vacuum enclosure terminating in a beam window 4 through which the electron beam emerges and impinges upon a product 5 supported on a product conveyor 6 which conveys the product 5 through the electron beam 3. The plane defined by the product conveyor 6 may be referred to as the "product plane". The resulting treatment of the product 5 may be referred to as "electron processing of matter", and includes sterilization, radiation chemistry and other well-known treatments. The apparatus of the invention determines the ionizing radiation dose delivered to the product 5 passing through the high energy electron beam 3. The electrons are accelerated in vacuum to energies in the range 100 to 300 kiloelectron volts or higher, and pass through the thin foil 4 into a product handling chamber at atmospheric pressure.

Electrons striking the window foil 4 and its supporting structure generate bremsstrahlung x-radiation 7. The x-ray flux is approximately proportional to the power of the electron beam, i.e. the beam energy (or accelerating voltage) multiplied by the beam current.

Thus, at a given accelerator voltage and current, the signal generated by an x-ray detector 8 can be calibrated to indicate the radiation dose rate delivered to the product 5. Typically, the product 5 is passed through the beam 3 on a conveyor belt 6, or as a web of material. If the dose rate is divided by the speed of the product, then the integrated dose received by the product 5 as it passes under the beam 3 can be calculated, displayed and recorded.

The sensitivity of the x-ray detectors 8 used in carrying out the invention is dependent upon temperature, with sensitivity increasing with temperature rise. Thus a correcting factor must be applied to the signal to eliminate the effect of temperature changes during warm-up and operation. Means for detecting the detector temperature may comprise a thermocouple as shown at T in FIG. 4.

At any given voltage detector signal amplitude is proportional to the dose rate delivered by the electron beam. Thus, the product of signal and a calibrating factor indicates dose rate at the product plane.

As the voltage is lowered below the mid-range, the vacuum window absorbs a greater proportion of the beam current, reducing the dose rate and therefore the value of the required calibrating factor.

As voltage is increased above the mid-range, the linear energy transfer function of the electrons striking the product surface decreases, that is, less dose per unit of electron current is delivered to the surface layers of the product. The product material has a reduced stopping power as the electrons become more energetic. This again affects the value of the calibrating factor for dose rate. Means for correcting for variations in product stopping power is shown by the energy-determining means mentioned hereinabove, together with the information provided by FIG. 8. It is indicated by the directional arrow from R(V) to $R_o$ in FIG. 4.

In one embodiment of the method of the invention, shown in FIG. 1, the following procedure is used to derive dose delivered.

1. Temperature of the detector 8 is measured, as by a thermocouple T shown at 10, and a correcting factor applied by multiplying the detector signal by a value proportional to the difference between a standard operating temperature at which the instrument is calibrated, and the actual temperature.

2. Voltage is determined by calculating the ratio of two x-ray detectors, a primary detector 8 and a filtered detector 9 which is occluded by a thin heavy metal foil 11. The effect of the filter foil 11 in reducing signal to the filtered detector 9 is a strong function of the x-ray energy spectrum, which is determined by the electron energy or machine voltage. In practice, the ratio is measured by a suitable Ratio circuit 12 for a series of known energy values across the operating range of the accelerator, and entered into a Voltage look-up table. Thus the machine voltage can be determined by the Ratio circuit 12 by measuring the primary/filtered signal ratio.

3. Similarly, the dose rate, at a constant current, can be measured by thin film dosimetry, for a series of known energy values over the operating voltage range of the accelerator, and entered into an Energy Transfer look-up table within a suitable Dose Rate circuit 13. Multiplying the temperature corrected primary signal by the value in this table for a given primary/filter ratio produces a dose rate which is corrected for beam voltage, window absorption, and energy transfer function.

4. Finally, the dose rate value is divided by the line speed of the conveyor or web carrying the product, and multiplied by a calibrating factor to present the integrated dose delivered. Means for determining the residence time is shown at "Tachometer" in FIG. 5 and by the Speed circuit 14 in FIG. 1. The integrated dose delivered is calculated by the Dose circuit 15.

Figure 2:
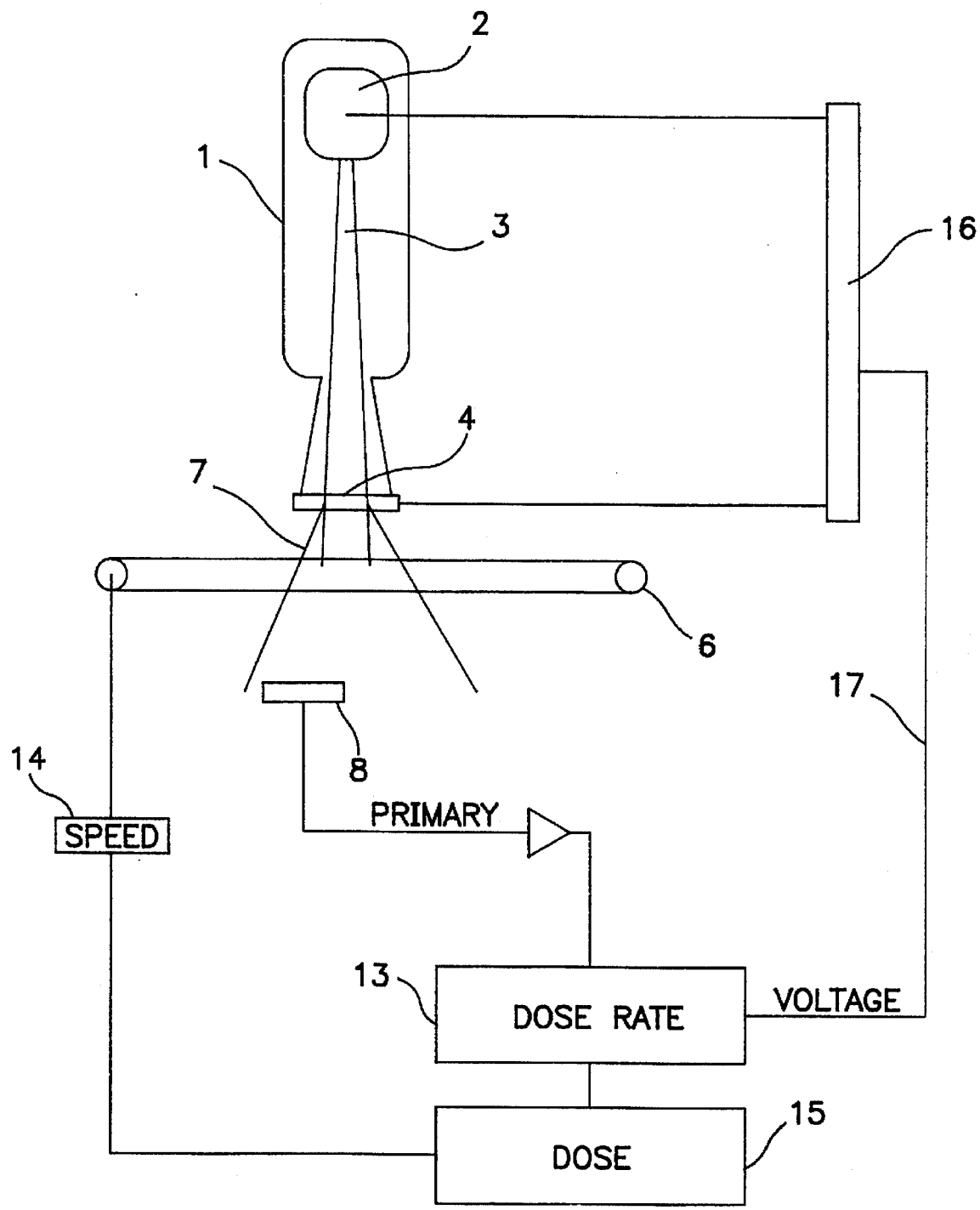
FIG. 2 is a view similar to that of FIG. 1 showing a first modification thereof.

Referring now to FIG. 2, therein is shown a modification of the apparatus of FIG. 1, wherein the energy of the electrons in the electron beam is measured by making use of the voltage dividing resistor 16 which is usually a part of the electron beam processor 1. In the embodiment of FIG. 2 a connection 17 is provided between a point on the voltage dividing resistor and the circuit which measures the dose rate.

Figure 3:
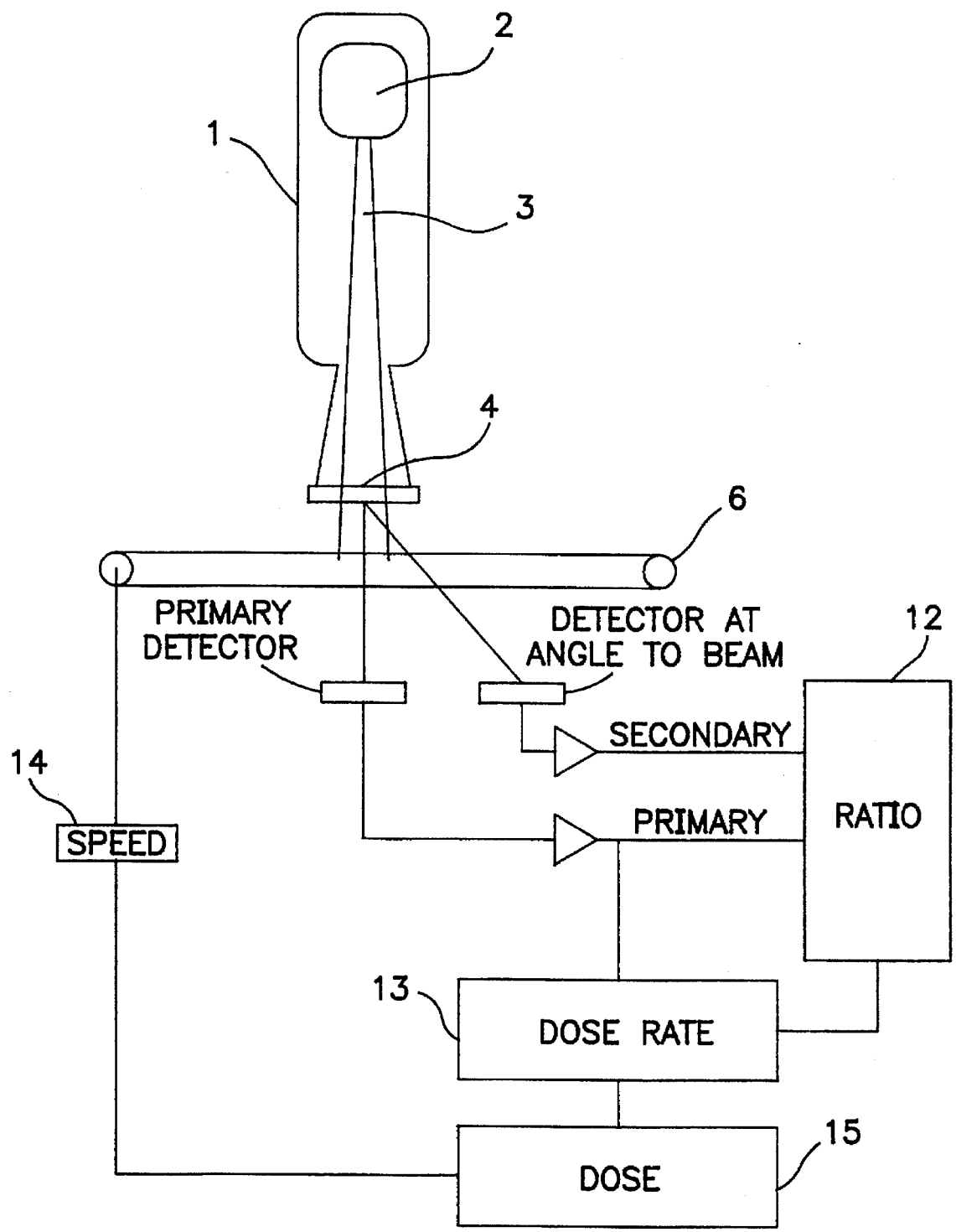
FIG. 3 is a view similar to that of FIG. 1 showing a second modification thereof.
Figure 12:
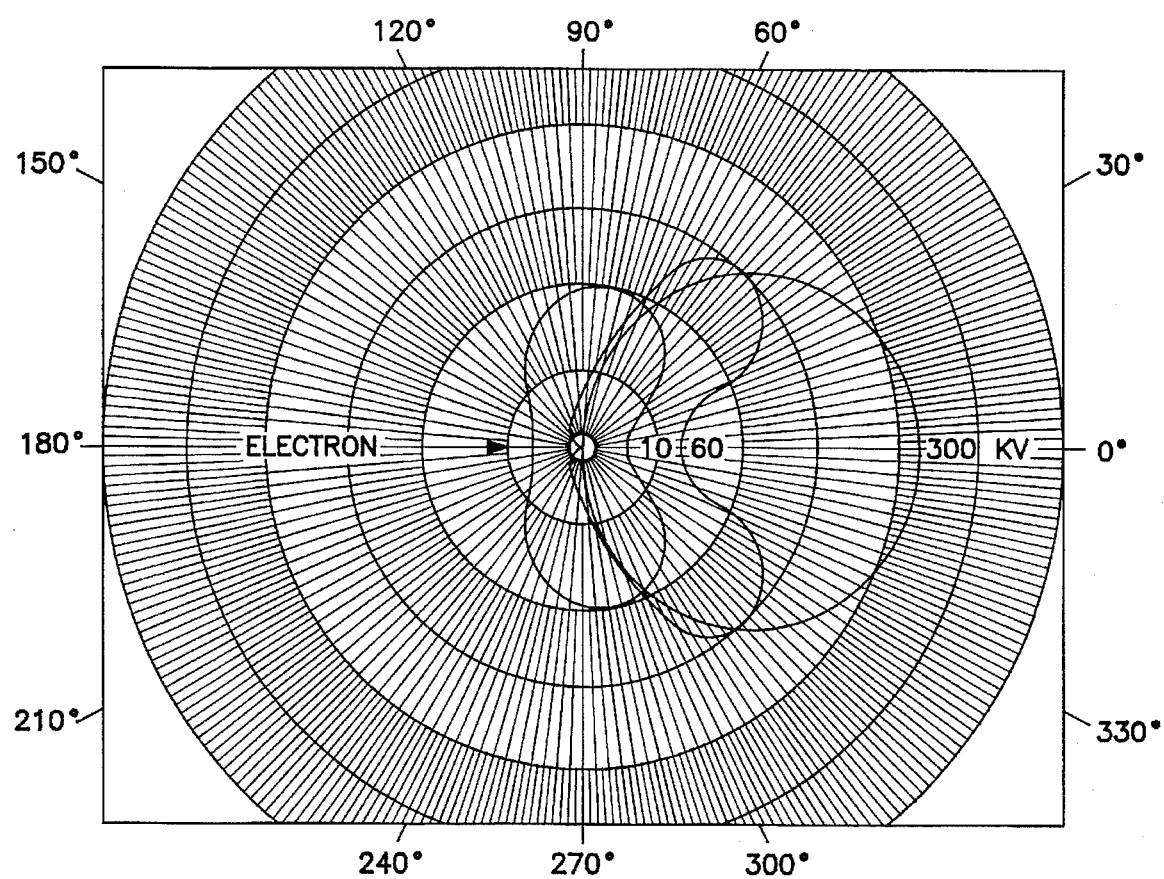
FIG. 12 is a polar diagram for continuous x-rays generated in a processor; in said polar diagram magnitude of flux is proportional to radial distance from the center of the circles, and is plotted, as a function of angle at which the flux radiates from the target, for electron beams having energies resulting from acceleration by voltages of 10, 60 and 300 kilovolts (kV)

Referring now to FIG. 3, therein is shown a modification of the apparatus of FIG. 1, wherein the energy of the electrons in the electron beam is measured by means of at least two x-ray detectors. Each x-ray detector may be similar to the x-ray detector 8 in FIG. 1. However, the two x-ray detectors of FIG. 3 are placed at different positions. It will be recalled from FIG. 12 that the intensity of the x-rays generated in the processor 1 is different for different points. By providing a signal from each of two different points, the embodiment of FIG. 3 provides a means for calculating the energy of the electrons, since the pattern of FIG. 12 varies as the energy of the electrons varies. In general, as the energy of the electrons is increased, the bremsstrahlung generated by that beam is concentrated towards forward direction as illustrated in FIG. 12.

It is important to understand the difference between FIG. 1 and FIG. 3.

FIG. 1 shows a primary and filtered detector pair arranged so they are at the same angle with respect to the incoming beam direction, although they do not need to be at the same angle. As the energy increases, the ratio of the primary to filter signals decreases, due to the absorption of the lower energy part of the x-ray energy spectrum by the filter. At higher energies, the part of the spectrum which is absorbed is a smaller fraction of the total energy seen by the primary.

FIG. 3 illustrates a quite different situation. As beam energy increases, more of the x-ray flux is directed in the forward direction, with less flux scattered out sideways. Thus, if two detectors, without filters, are located at different angles with respect to the incoming electron beam direction, the ratio of the signals will change as energy changes, giving us a measure of the electron energy, i.e. the accelerating voltage. This is shown in FIG. 12, where the higher voltage x-rays are more forward directed.

Figure 4:
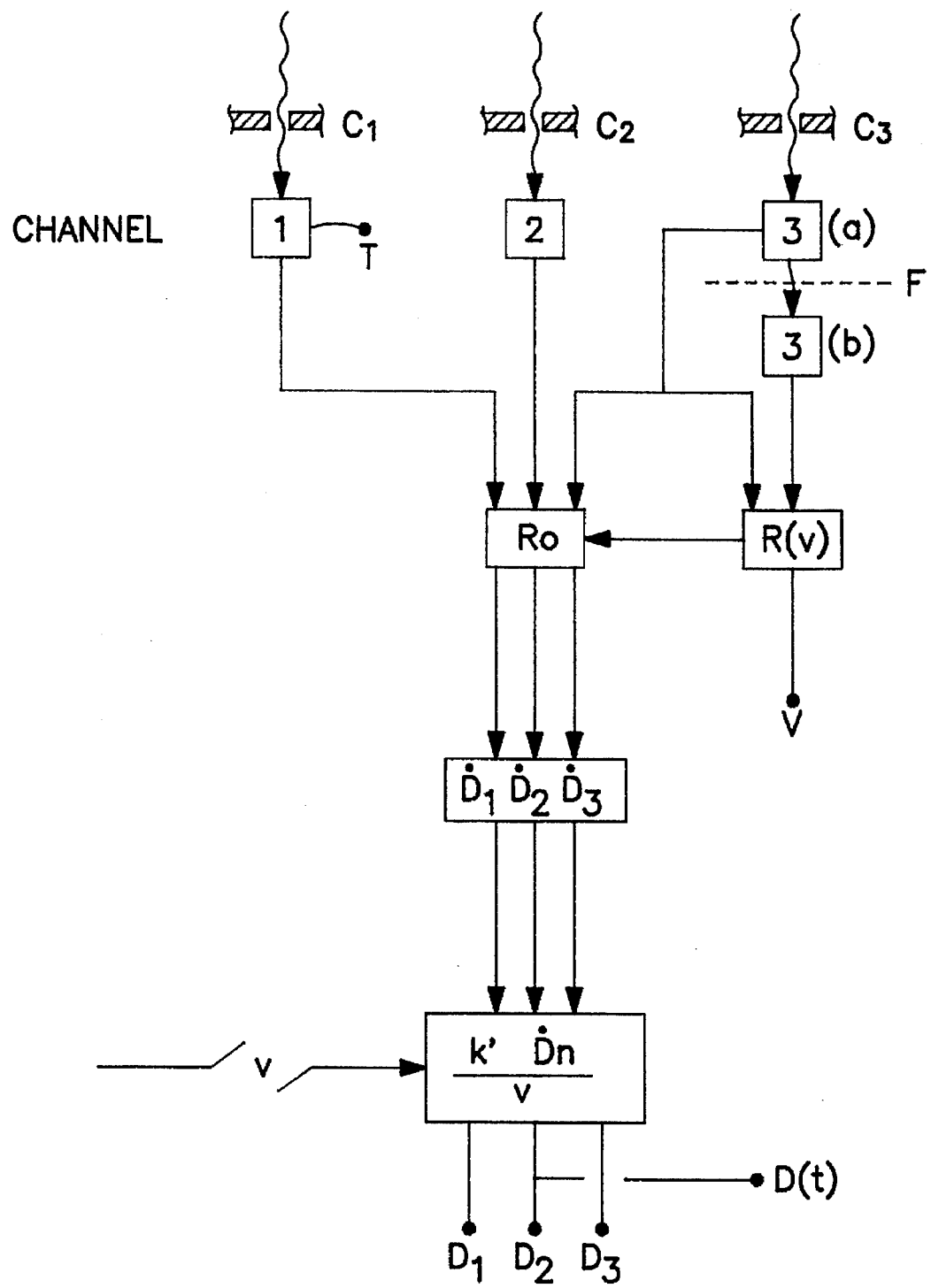
FIG. 4 is a data processing schematic.
Figure 14:
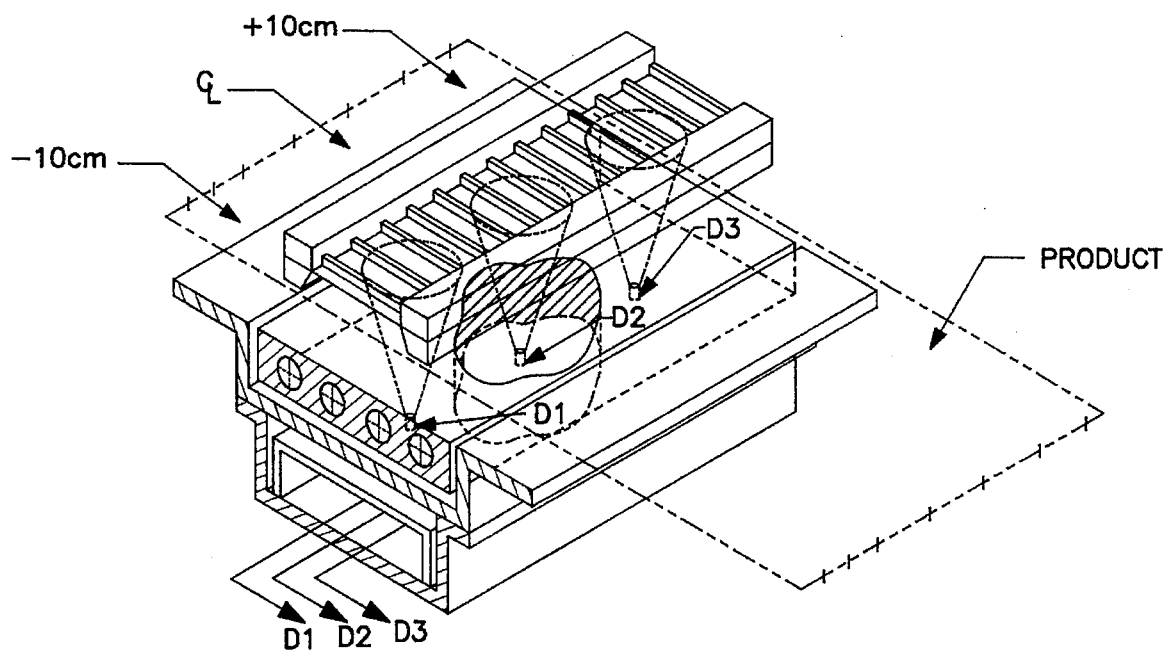
FIG. 14 is an isometric view of a portion of the apparatus of FIG. 13.

The procedure used to derive dose delivered is shown in greater detail in FIGS. 4 through 7. Referring thereto, FIG. 4 is a data processing schematic. $C_1$, $C_2$ and $C_3$ each represents a collimator which limits the bremsstrahlung arriving at each detector. For example, FIG. 14 shows three different positions for a collimator/detector unit. In FIG. 4 the detectors are identified by the numerals 1, 2 and 3 in block diagrams aligned horizontally with the legend "Channel". A thermocouple T is shown as being connected to the first detector. Unfiltered signals from each detector are fed to the $R_o$ circuit, which also receives an energy signal providing correction for energy variations. One such energy signal is shown for the third channel, in which unfiltered and filtered signals are fed to the R(V) circuit, which indicates voltage V and also feeds an energy correction signal to the $R_o$ circuit. The $R_o$ circuit feeds the dose rate circuit (D-dot) which in turn feeds the final correcting circuit, which also receives a product-velocity (i.e. a residence-time) signal from the tachometer and calculates the dose D, making use of the accelerator yield factor k'.

Figure 5:
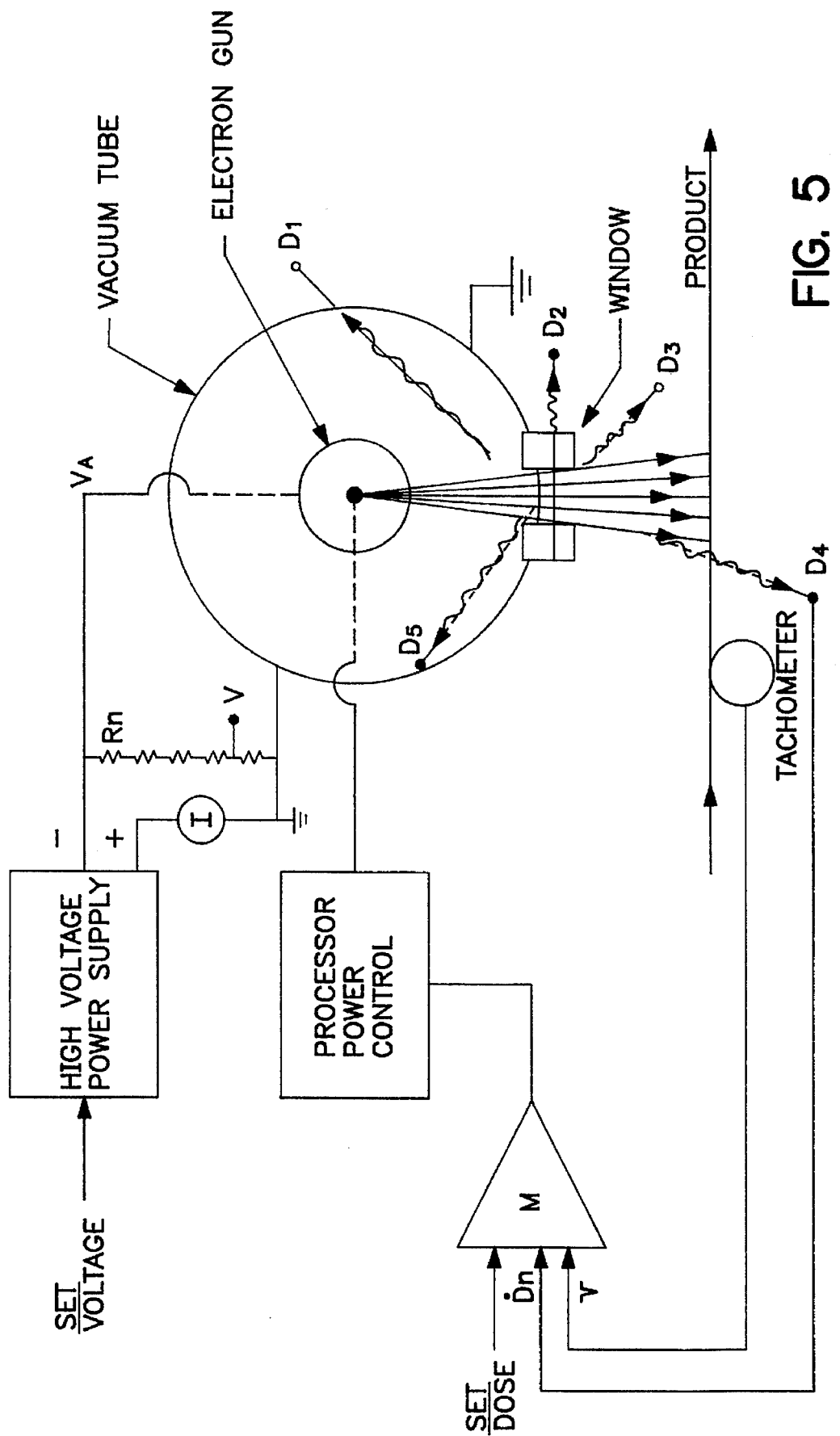
FIG. 5 is a view similar to that of FIG. 1 showing a modification thereof.

FIG. 5 is an electron processor schematic for slaved operation, wherein the various dose-rate signals D-dot-sub-n from the various detectors are fed to a monitoring circuit, which also receives a velocity signal from the tachometer. A set-dose signal is also fed to the monitoring circuit, which calculates the necessary correction (as, for example, in terms of beam current) and feeds the correcting signal S to the process power control circuit for automatic alteration of the beam current to maintain proper dose.

Figure 6:
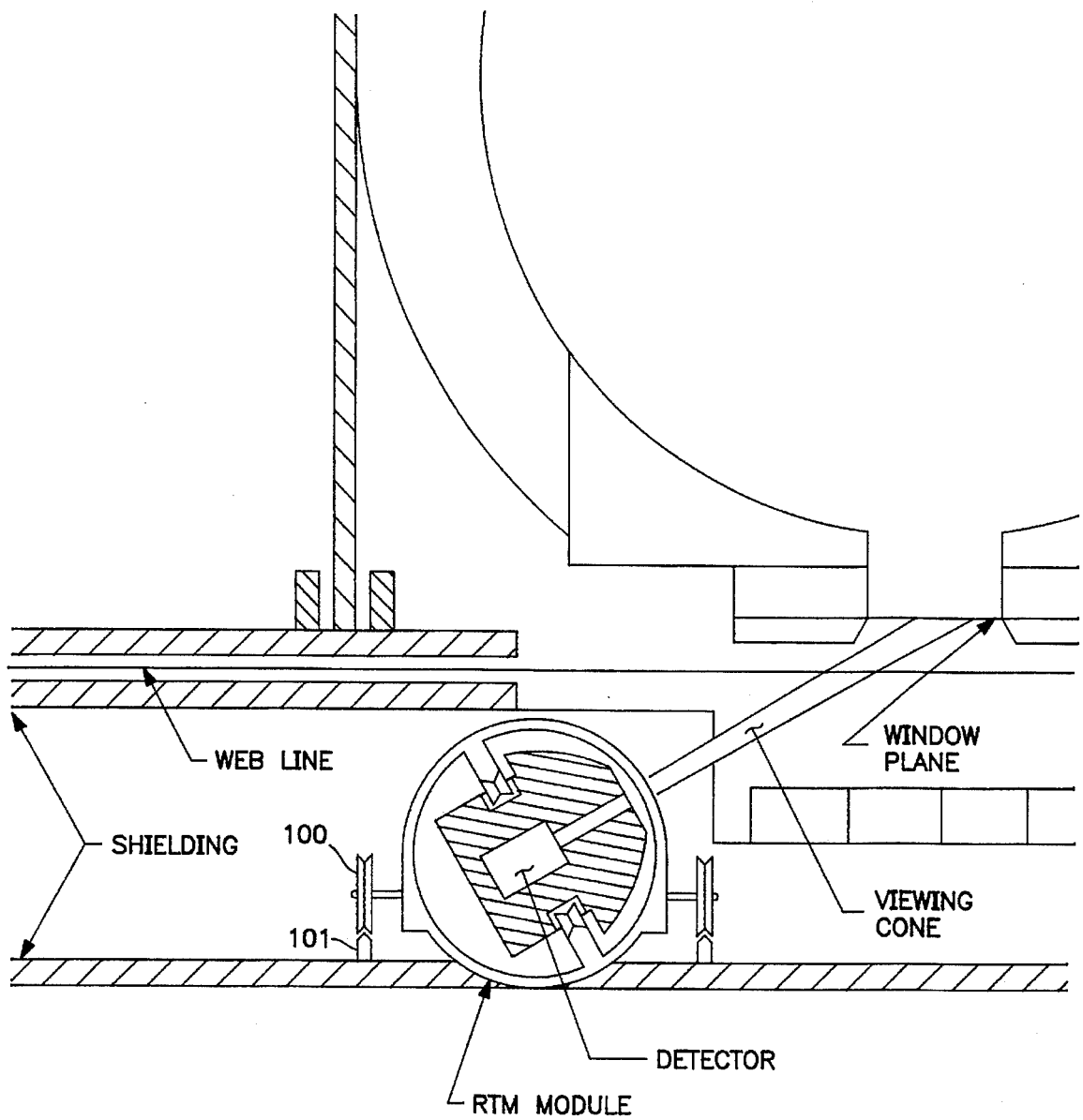
FIG. 6 is a detail of a portion of the apparatus of FIG. 1.
Figure 7:
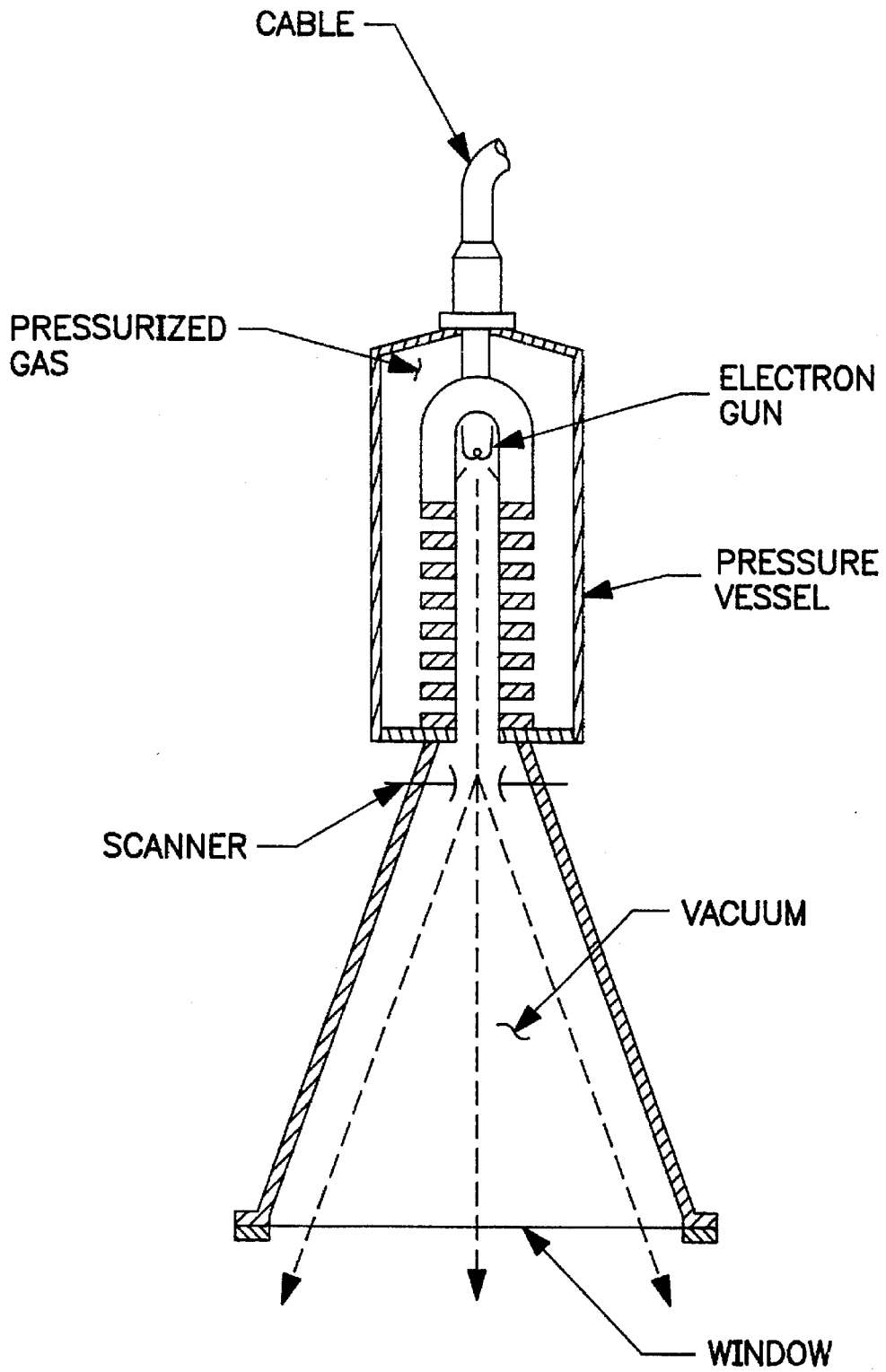
FIG. 7 is a view, similar to that of FIG. 1, showing a conventional scanned system.
Figure 13:
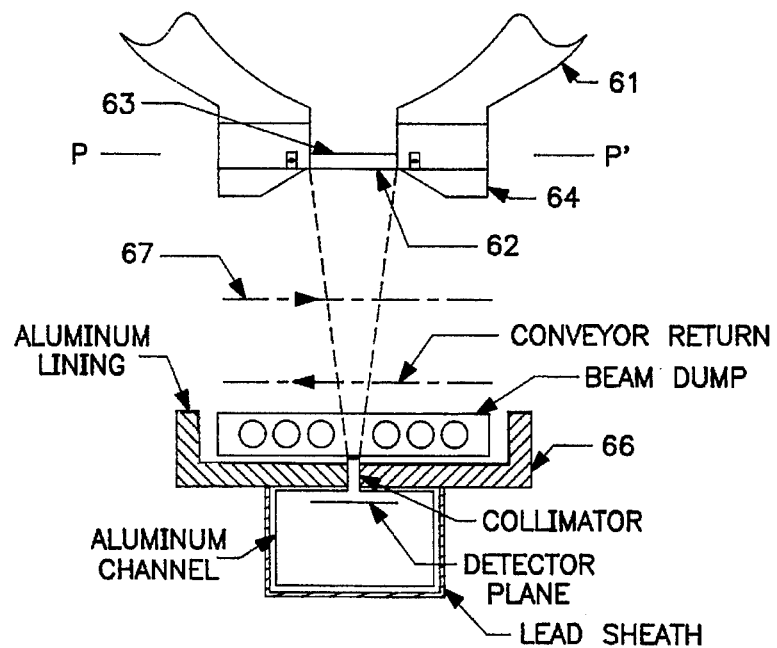
FIG. 13 is a view, primarily in vertical central section, showing the geometry of a real time monitor constructed in accordance with the invention.

FIG. 6 is a detail view of a collimator/detector unit, like that shown in FIGS. 13 and 14, showing its position inside suitable shielding and mounted on a track 101 by means of wheels, so that a single collimator/detector could be moved to a number of different positions, such as the three positions shown in FIG. 14, or as for use in continuous scanning along the electron accelerator window or product plane.

Figure 8:
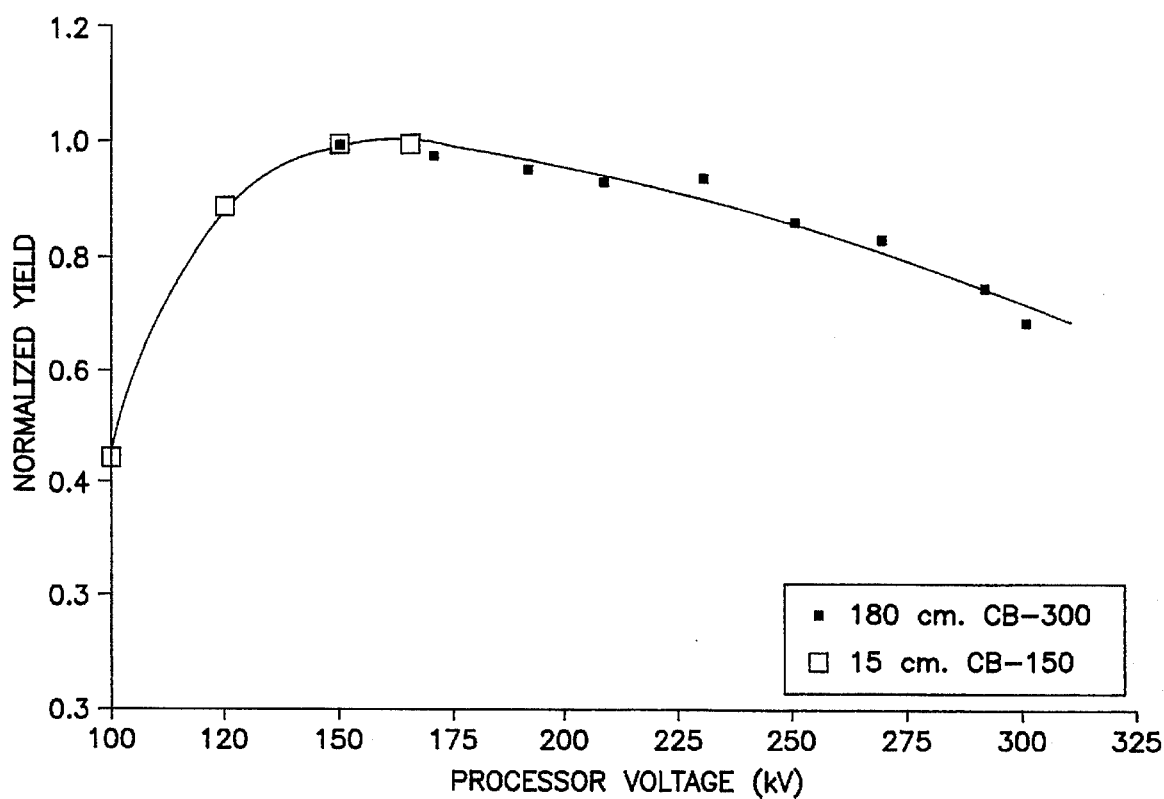
FIG. 8 is a graph showing yield variation with processor operating voltage.
Figure 9:
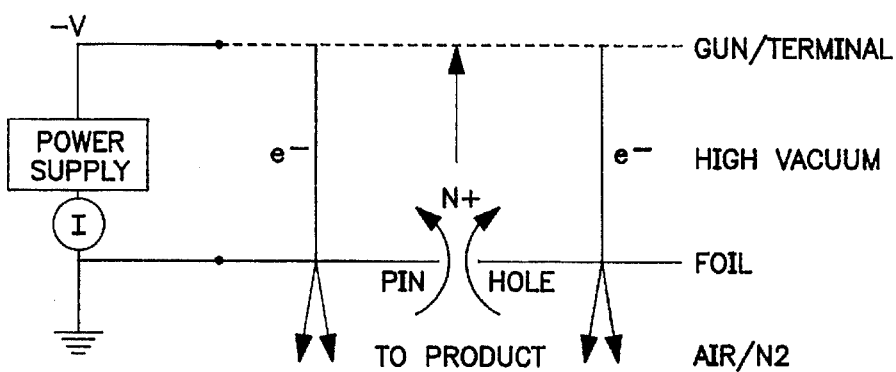
FIG. 9 is a diagram showing schematically the indeterminate nature of the power supply return current as as a measure of the actual beam current under conditions of significant window leakage.
Figure 10:
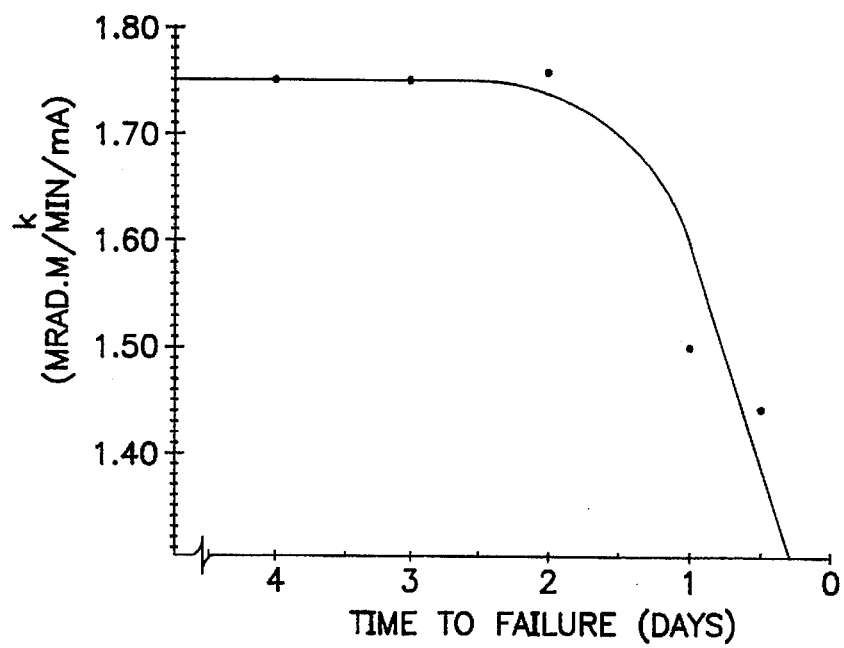
FIG. 10 is a graph showing yield deterioration with window pinholing.

Referring to the data processing schematic of FIG. 4, channel 3 of this 3-channel system uses a detector pair (3a and 3b) to look at different portions of the bremsstrahlung spectrum. The "filtered" detector 3b uses a high atomic number absorber F (such as tantalum or molybdenum) to absorb a portion of the spectrum admitted by the confining collimator C3. The ratio of these signals R(V) provides a unique determination of the energy E of the electrons generating the bremsstrahlung, and, hence, of the operating voltage V of the processor. Data from all "n" monitoring channels can then be corrected to the standard operating voltage V based upon the appropriate correction factor for the signals $S_n$. Because signal $S_n$ is actually proportional to dose rate $\dot{D}_n$, this signal must be then corrected by the yield factor for the machine k' (as shown in FIG. 8) and the product speed v; that is: $D_n = k' \dot{D}_n / v$.

The invention includes means for causing the radiation detector with collimator to traverse the bremsstrahlung source. Such means is shown in FIG. 6, where the detector is mounted on wheels 100 so as to be able to move on tracks 101 along the beam width. The invention may also be used with accelerators having means to scan or pulse the electron beam, such as that shown at "scanner" in FIG. 7.

The elements 3(a), F, 3(b) and R(V) shown in FIG. 4 may be used to generate an energy signal and signal to correct the flux signal. The meter shown at I in FIG. 5 may be used to generate an electron current signal.

The detectors are shown in various positions D in FIG. 5. Referring to said FIG. 5, the precision voltage divider $R_n$ consists of a large number of high resistance (100 megohm) resistors in series so that it represents a low current drain (e.g. less than 100 microamperes) on the power supply. Signal V at the ground end of the "string" can then be used to make a precision determination of $V_A$, the actual voltage applied to the accelerator or the electron processor's electron gun. The bremsstrahlung detectors can be positioned at suitable locations to suit the system to provide signals $D_n$ as shown in FIG. 4. For example, (in FIG. 5) $D_1$ is outside the vacuum chamber, $D_2$ is at the window plane, $D_3$ is between the window and the product, $D_4$ is below the product (suitable for thin, uniform product), and $D_5$ is interior to the vacuum chamber. These signals ($D_n$) and speed (v) are supplied to the real time monitor (M) so that the calculated dose can be compared with the desired (set) dose to provide an appropriate signal S for the adjustment of the processor electron current.

At the energies of immediate interest for electron processor monitoring, the bremsstrahlung distribution generated by the electrons striking the window frame is relatively isotropic, (see FIG. 12), so that the bremsstrahlung intensity, which is proportional to the electron current density at the target, $j_e$, as well as the electron energy, E, can be monitored in whichever direction is most convenient. Much of the present work has been performed with the detector array in the forward direction, as shown in FIG. 13, while measurements have also been made orthogonal to the beam in the stopping plane ($pp^1$ in FIG. 13) to confirm the reciprocity of measurements made in both directions. As shown in FIG. 13, the principle of the monitoring system is to provide continuous measurement of collimated bremsstrahlung generated at the window frame stopping plane (see FIG. 14) where some 20–25% of the electron beam is intercepted by the window support structure. However, the principle of the monitoring system may be used with apparatus in which the window support structure is modified or eliminated. The bremsstrahlung intensity generated by this "stopped beam" is proportional to both the electron current $j_e$ and E, so that if the bremsstrahlung signal is corrected for Voltage i.e. E, variation, then a direct measure of $j_e$ can be derived. Since $j_e$ is a measure of the dose rate delivered by the electron beam at the window plane, and ultimately at the product, we can use the relationship $$\dot{D} = f(j_e, E)$$

to derive dose rate from the bremsstrahlung signal, and then convert it to dose via $$D = \int_0^t \dot{D}\, dt$$

where the integral is taken over the period of product exposure to the beam in the process zone. A further complication of the monitoring of this spectrum is the presence of characteristic x-rays of the stopping material and the associated Auger electrons. For typical window frame materials (Al, Z=13, Cu, Z=29) the fluorescent yields (x-ray emission probability from an inner shell vacancy) are very low (4% and 40% respectively), with x-ray or Auger electron energies so low that simple filtering at the detector or by the chamber wall completely absorbs them. For example, the $K_1$ line of copper is 8.047 KeV which is easily absorbed in, for example, 100 microns of Ta (1660 g/m$^2$) or 50 microns of Cu (445 g/m$^2$), while the low energy Auger electrons cannot penetrate the accelerator vacuum envelope. At the energies typical of external beam electron processors, say in the region above 100 kilovolts, there is always sufficient bremsstrahlung for real time monitoring. For example, using Wiedmann's formula as disclosed, for example, at, Kirkpatrick, P. and Wiedmann, L., Phys. Rev. 67, 321, 1945; Condon, E. U., Ch. 8, 7–118, *Handbook of Physics*, ed. E. U. Condon and H. Odishaw, McGraw Hill, NY (1958) the thick target efficiency for conversion of electron kinetic energy into bremsstrahlung is given by $1.3 \times 10^{-3}\, ZV$ where Z is the target atomic number and V the electron accelerating voltage. For the case studied here with an Aluminum (Z=13) frame at 200 KV, this efficiency is $3.4 \times 10^{-3}$ or 0.3%. One sees that the bremsstrahlung yield varies roughly linearly with energy and with the atomic number of the target. For the geometry shown in FIG. 13, at 200–300 KV, we would expect the signal to vary somewhat more than linearly with V, due to the shifting of the distribution to the forward direction (as illustrated in FIG. 12).

Referring to FIGS. 13 and 14, an electron beam produced in the vacuum chamber 61 passes through the window foil 62 which is supported by support fins 63 and attached to the vacuum chamber 61 by a foil clamp 64. A suitable detector 65 is positioned below a suitable apertured lead shielding 66 which collimates the x-rays before they reach the detector 65. The lead shielding 66 contains a beam dump for absorbing electrons which have not been stopped by the window foil 62, the conveyor 67, or any products on the conveyor 67; this absorption of electrons ensures that the radiation detected by the detector 65 will include only bremsstrahlung x-rays and not electrons in the electron beam. The aperture in the lead shielding 66 acts as a collimator for defining the cone of bremsstrahlung which reaches the detector 65. Three positions of the collimator/detector are shown in FIG. 14.

CORRECTING THE DETECTOR OUTPUT

In order to correct the detector dose rate output to a useful Dose indication, it is necessary to divide by a signal which is proportional to v, the product speed, in addition to the yield factor k for the processor. This is accomplished via the tachometer generator output signal, which is proportional to product speed, and is handled in the same way in which the microprocessor controller normally calculates Dose given the machine yield k, current I and speed v. If there is no velocity signal available, as, for example, in a start-stop irradiation sequence, the calibrated detector is used to integrate to a predetermined signal level Q, at which point the desired dose (or charge fluence on the product) has been achieved.

$$D = kQ = k' \int i\, dt$$

For both modes of application, the detector signal output must be related to D through traceable film dosimetry.

The second correction which is required is to compensate for voltage variations in the accelerator. As predicted by Wiedmann's formula, while these may not significantly affect the dose delivered by the electron beam, they may very significantly affect the bremsstrahlung yield, hence the x-ray detector signal generated at a fixed current in the processor.

The following software logic has been developed for the real time correction of the detector signal for voltage variations in the processor. Suitable programs include "WorkBench PC Data Acquisition & Control Software for MS DOS Compatible Computers" manufactured by Strawberry Tree Incorporated, Sunnyvale, Calif., and "EasyPlot" Scientific Plotting & Data Analysis Software manufactured by Spiral Software, Inc., Brookline, Mass., for deriving the polynomial hereinafter mentioned.

Figure 15:
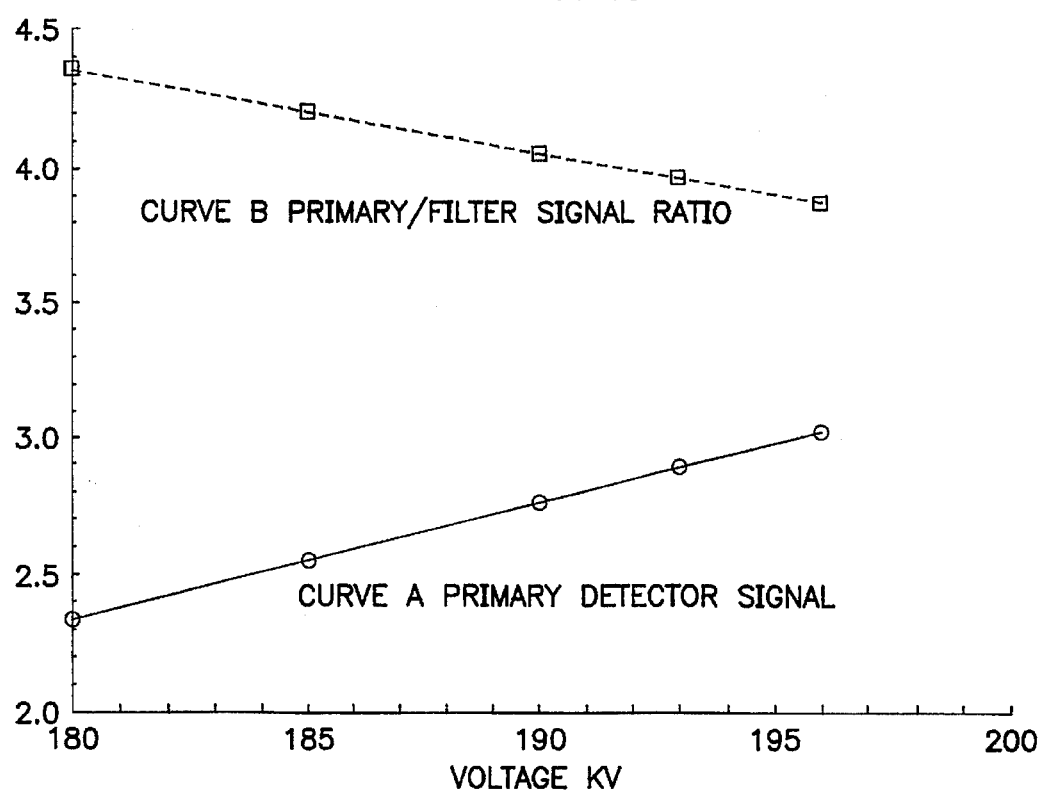
FIG. 15 is a graph showing voltage dependent signals; curve A shows the variation of signal current (in megarads)

(1) As shown in curve A of FIG. 15, the output signal of the detector used to monitor the forward bremsstrahlung as in FIG. 13 is plotted as a function of voltage at constant machine current. The behavior of this curve shows the expected third order dependence of the detector signal on voltage. That is, the bremsstrahlung flux in this geometry varies roughly as the cube of the voltage ($V^3$); hence the 29% increase shown over the 180–196 KV range. The non-linearity of the output is caused by the increase in bremsstrahlung yield with energy coupled with its increased peaking in the forward direction, and possibly an energy dependent variation in detector efficiency. The non-linear variation can be closely approximated by a second order polynomial.

(2) Curve B shows the ratio of the signal from the primary detector used for curve A to that of a second detector viewing the same source but shielded with a thin x-ray absorbing filter. This ratio provides an unambiguous indication of machine voltage setting with good resolution, and offers a basis for voltage correction of the primary signal. The optimum absorber thickness will vary with bremsstrahlung energy and can be chosen for maximum sensitivity—in this case the filter selected gave a roughly 4:1 ratio over the 180–200 KV operating region studied. For the system used in these studies, it was confirmed that the signal ratio at a given voltage is independent of current over a broad current range as would be expected.

(3) In FIG. 16, the signal correction factors are plotted as a function of detector signal ratios and are fitted with the correction polynomial shown. In this plot, the correction factor y is unity at 190 KV where the detector signal ratio is 4.06. It is expected that data corrections within one percent should be practicable using this polynomial fit to the experimental data, or via the use of the equivalent "look-up" table.

FIG. 16 is derived from the data shown in FIG. 15. In order to construct FIG. 16, one must also decide upon the voltage to which the data is to be "normalized". In constructing FIG. 16, the data was normalized to the value of the primary signal at 190 KV, the normal operating voltage of the processor. The data points in Curve A of FIG. 15 may be tabulated as follows:

| Voltage | Primary Detector Signal |
| --- | --- |
| 180 KV | 2.338 |
| 185 | 2.603 |

-continued

| Voltage | Primary Detector Signal |
| --- | --- |
| 190 | 2.768 |
| 193 | 2.898 |
| 196 | 3.029 |

The correction multiplier at any particular voltage is given by dividing the value of the primary detector signal at 190 KV shown in FIG. 15 by the value of the primary detector signal at that particular voltage shown in FIG. 15. This results in the following table:

| Voltage | Correction multiplier |
| --- | --- |
| 180 KV | 2.768/2.338 = 1.184 |
| 185 | 2.768/2.603 = 1.063 |
| 190 | 2.768/2.768 = 1.000 |
| 193 | 2.768/2.898 = 0.954 |
| 196 | 2.768/3.029 = 0.914 |

In operation, a convenient indication of the voltage is the value of the Primary/Filter signal ratio for that voltage. Therefore, in constructing FIG. 16 the data-point values of the correction multiplier are plotted as a function of the corresponding values of the Primary/Filter ratio rather than the values of the voltage. The relationship between the Primary/Filter signal and the voltage is shown by Curve B of FIG. 15.

(4) As a demonstration of the efficacy of the procedure using the unexpectedly sensitive correction factor, a run was performed in which the readout of the signal to be corrected was set at 3.15 Mrads at 190 KV, and the correction polynomial just described was used to correct the output signal. In FIG. 17, the uncorrected output signals at five voltage settings at fixed beam current are shown in curve A while curve B shows the corrected output in Megarads (as shown on the ordinate). Curve C shows the behavior of the ratio data (primary to filtered detector signals) from which the voltage dependent correction factor of FIG. 15 is determined. For example, at 180 KV the ratio is 4.4 from which a correction factor (see FIG. 16) of approximately 20% or 1.2 is applied, raising the 2.7 Megarad indicated uncorrected output to a corrected value of 3.2 Megarads. Finally, the correction of the detector output for temperature is quite straightforward. A thermocouple is used to determine the temperature of the detector array in the real-time-radiation-monitor cavity of FIG. 13, and an appropriate linear correction is then made to the data to compensate for the thermal coefficient.

Electron Energy Determination

The instant invention comprehends three methods of determining the energy of electrons reaching the anode plane and hence the product.

Voltage Measurement

The first and most obvious method is to monitor the accelerating voltage, usually by means of a resistor string as noted above, (which method suffers from errors due to aging of the resistors) or by electrostatic means such as a generating voltmeter. The latter is expensive, and not normally available in these accelerators. In addition, certain accelerator designs such as linear accelerators may not offer means of directly measuring the accelerating voltage. A suitable high resistor chain is shown at $R_n$ in FIG. 5.

Filter Method

A second method is to measure the change in energy spectrum of the bremsstrahlung radiation as the electron beam energy changes. This is done by measuring the x-radiation from the target and comparing the signal to a measurement through an absorbing filter placed in front of the detector. The ratio of unfiltered signal strength to filtered signal strength bears a unique relation to the energy of the electrons striking the target. This method can be used with a single detector by measuring alternately with and without a filter, or preferably two detectors, one primary and one filtered, can be used to simultaneously monitor both signals for a continuous measurement. Some details regarding this method are described herein in connection with FIGS. 15, 16 and 17. Means for measuring the ratio between the flux signals generated by the radiation detectors is shown at 3(a), F and 3(b) in FIG. 4.

Anisotropy Method

A third method of measuring energy is to view the bremsstrahlung radiation from two different angles with respect to the direction of the impinging electron beam, and to measure the relative change in intensity with energy. As electron beam energy increases, the bremsstrahlung x-ray intensity in the forward direction increases relative to side directed radiation. The ratio of forward to side directed signal strengths is a unique indicator of the energy of the electrons striking the target. As in the filter method, a single detector can be used and the angle changed between measurements, or preferably, two or more detectors can be fixed at different angles to simultaneously measure the two signals, and from their ratios, to determine the electron energy.

PERFORMANCE VERIFICATION

The performance of the real time radiation monitor described here has been studied on a 250 KV electron beam sterilizer during a series of 8 hour continuous runs. For this application, the dose to the product is typically set at 3.10 Megarads at an operating voltage of 190 kilovolts, and the Good Manufacturing Procedures (GMP's) used in the application require thin film traceable radiochromic dosimetry determinations of output (dose delivered) hourly. This dosimetry must be traceable to a standard such as that maintained by the National Institute of Standards and Technology. Some typical data are shown in FIG. 18 in which data from the RTRM corrected for voltage and temperature and averaged over 10 minutes, are plotted against time for approximately 13 hours. The sixteen film dosimeter readings taken over this period show a standard deviation of ±2.1.% while the real time radiation monitor corrected data show a standard deviation of ±1.3%. Although this improved performance is impressive, the dosimetry is compromised by small variations in line speed due to the manually "fixed" nature of the conveyor drive unit. No continuous correction was made in the real time radiation monitor data for conveyor speed, nor was the real time radiation monitor dose data calibrated to the film dosimeter readings.

The real time radiation monitor has demonstrated the capability of yielding data accurate to one percent when the voltage and temperature corrections are applied using the techniques described here. This is about a factor of three better than can be achieved with good dosimetric techniques, and of course is performed in real time, unlike the extended delays involved in the use of passive dosimetry which require time for mounting, irradiating, annealing and then reading the films.

An example of the performance of a single channel real time monitor under the beam centerline of the 30 cm electron sterilizer (see position D2 in FIG. 14) is illustrated in FIG. 19. Under typical operating conditions of the sterilizer, the signal is shown to average 0.0636 for the first 30 seconds of the study. Then the permanent magnet used in the work of FIG. 11, was positioned to disturb the beam distribution as shown in that figure, and the real time radiation monitor signal on the centerline fell to 0.0437, a drop of 31%. As shown in the dosimetry of FIG. 11, the delivered dose on the centerline was reduced by 18% (from 3.58 to 2.95 Megarads). Such a discrepancy is consistent with the geometry of the experiment (see FIG. 13). The dosimetric survey of FIG. 11 provides a map of the integrated dose delivered at the conveyor surface including large angle contributions from the ends, whereas the real time radiation monitor signal is confined to measuring the well defined cone of radiation defined by the radiation monitor collimator—hence confined to ±7.8O for the geometry used.

Other array geometries are practicable with narrow angle collimators used to view the window plane from a distance (e.g. above the vacuum chamber or inside a radiation vault for non self-shielded processors). Moreover, the use of a traceable real time radiation monitor to control a processor is disclosed here, rather than simply using the device for monitoring processor performance. In the case of its use as the primary signal for control, a single detector output is employed as the dose rate indicator. The signal is corrected for voltage and temperature and yield, so that at the product speed selected, it is used as the real time measurement of dose delivered. As a consequence, the machine parameters (current) can be adjusted based upon its output at, say, ±1% error limits. Means for controlling dose rate by control of the electron beam current is shown by the block entitled "Processor Power Control" in FIG. 5. This method of machine control, which is independent of backstreaming ion effects or electron optical perturbations, is much more reliable than the usual control philosophy based upon the return electron current to the high voltage power supply.

Such a system would typically employ one detector channel, or the average of several detector channels, arranged so as not to be influenced by product transit and absorption. For example, viewing the ends of the window (see FIG. 14) avoids absorption by narrow products traversing the central region of the beam. This problem is eliminated if the detectors are mounted not in line with to the window stopping plane, such as in plane PP' of FIG. 13. Uniformity would be determined in real time with or without continuous product in place in the processor. Machine voltage setting would be confirmed by the ratio recorded for the correction of data by the software as described above. The traceability of the system would be verified using traceable film dosimeters and periodically confirming that the output dose reported by the real time radiation monitor channels, undisturbed by product, were in acceptable agreement with the simultaneously determined dosimetric performance.

Equally effective geometries for use of such a monitor may utilize x-rays generated by the beam at the product "plane"; e.g. plane RR' in FIG. 14. For fixed geometry production applications such as film, irradiated as it passes over a chill roll or drum, or for steel coil or plate in which the electron beam is totally absorbed, it is quite practicable to use the x-rays (bremsstrahlung) generated at this plane rather than the window itself. In these instances, the same calibration techniques are used for the film: drum or metal coil geometries used in production treatment of the product.

Other techniques for the application of this flexible device to electron processing, both for continuous and stop-start operation, will be apparent to those skilled in the art of energetic electron applications for a variety of industrial processes.

Having thus described the principles of the invention, together with several illustrative embodiments thereof, it is to be understood that, although specific terms are employed, they are used in a generic and descriptive of the sense, and not for purposes of limitation, the scope of the invention being set forth in the following claims.

We claim:

1. Apparatus for measuring properties of an electron beam, for use in electron processing of matter and in x-ray generation wherein said electron beam is directed at a product plane, comprising at least one radiation detector for measuring the bremsstrahlung flux at the position of the detector and for generating a flux signal indicating said flux, means for determining the energy of the electrons in said electron beam and for generating an energy signal indicating said energy, means including said energy signal for correcting said flux signal so that the corrected flux signal, when multiplied by a signal proportional to the residence time of a product in the beam, will be a measure of the dose delivered by the electron beam at the product plane, means for generating a residence signal proportional to the residence time of the product in the beam, and means for multiplying said corrected flux signal by said residence signal.

2. Apparatus according to claim 1, wherein said means for generating a residence signal includes a tachometer or an instrument for measuring the product's translational velocity through the beam.

3. Apparatus according to claim 1, further including collimating means for defining the cone of said bremsstrahlung reaching each detector.

4. Apparatus according to claim 1, further including at least one absorber for partially filtering the bremsstrahlung reaching said detector.

5. Apparatus according to claim 4, further including a first radiation detector and a second radiation detector and an absorber for partially filtering the bremsstrahlung reaching said first radiation detector, wherein said means for determining the energy of the electrons includes means for measuring the ratio between the flux signals generated by said first radiation detector and said second radiation detector.

6. Apparatus according to claim 1, further comprising at least one additional radiation detector is provided at an angle to the electron beam differing from the angle at which said detector is provided, and wherein said means for detecting the energy of the electrons includes means for measuring the ratio between the flux signals generated by said detectors.

7. Apparatus according to claim 1, further comprising means for detecting the detector temperature and generating a temperature signal indicating said temperature, and wherein said means for correcting said flux signal includes said temperature signal so that the corrected flux signal is essentially unaffected by variations in said temperature.

8. Apparatus according to claim 1, further comprising a multiple detector array and means for detecting relative detector sensitivities in said multiple detector array to generate sensitivity factors indicating said relative sensitivities, and wherein said means for correcting said flux signal includes said sensitivity factors so that the corrected flux signal from each detector is essentially unaffected by differences in said sensitivities.

9. Apparatus according to claim 1, further including means for exposing a product to radiation consisting of said electron beam or of said bremsstrahlung generated by said electron beam, means for determining the residence time of said product in said radiation, and means for correcting the flux signal for said residence time to provide a measure of dose received by said product.

10. Apparatus according to claim 1, in which the detectors are traceable to a national dose standard via calibration with passive dosimetry.

11. Apparatus according to claim 1, further including means for correcting for variations in product stopping power for electrons so that a surface dose correction is made as a function of energy.

12. Apparatus according to claim 11, further including means for correcting the voltage dependent machine yield, so that the dose rate measurement is adjusted for energy dependent variations in energy absorption from the electron beam in the air path between the window and the product, in the window itself, and in the stopping power of the product.

13. Apparatus according to claim 12, further comprising an electron source operated at a nominally fixed voltage, and including means for controlling, within preset limits, the dose rate delivered by the electron source by control of the electron beam current.

14. Apparatus according to claim 12, further including means for controlling, within preset limits, the dose delivered to the product, such control being effected through adjustment of the product residence time in the electron beam.

15. Apparatus according to claim 1, further including means for causing said radiation detector to traverse said bremsstrahlung to provide a measurement of the electron beam distribution generating the bremsstrahlung monitored.

16. Apparatus according to claim 1, further including an array of said radiation detectors in fixed positions for providing a continuous measurement of the electron beam distribution generating the bremsstrahlung monitored.

17. Apparatus according to claim 1, wherein said electron beam is scanned or pulsed, and wherein said apparatus provides a measure of uniformity, of integrated dose delivered, and of average operating voltage in an electron accelerator.

18. Method of measuring properties of an electron beam in an electron processor system, comprising the steps of measuring the bremsstrahlung flux at a known position and generating a flux signal indicating said flux, determining the energy of the electrons in said electron beam and generating an energy signal indicating said energy, and using said energy signal to correct said flux signal so that the corrected flux signal is proportional to the electron beam current density and is essentially unaffected by variations in energy of the electrons in said electron beam.

19. Method in accordance with claim 18 further comprising the steps of confirming electron optical stability of a processor for the irradiation of a product by radiation produced by an electron beam, determining the electron current in said electron beam, generating an electron current signal indicating said electron current, and using the ratio of said electron current to said corrected flux to confirm said processor electron optical stability.

20. Method in accordance with claim 18 further comprising the steps of detecting transients which affect irradiation of a product by an electron beam, using the detection of short term excursions from the corrected flux signal as a measure of the voltage stability of the processor system.

21. Method in accordance with claim 20, wherein said transients are low level transients reflecting conditioning activity in a high voltage accelerator, and wherein said method includes the step of measuring the frequency of said excursions of the flux signal from its time average during the electron exposure time for the product, as a prompting signal for preventive maintenance of the electron processor system.

22. Method of warning if positive ion effects due to vacuum system leakage are serious during irradiation of a product by radiation produced by an electron beam, comprising the following steps: measuring the bremsstrahlung flux at a known position, generating a flux signal indicating said flux, determining the electron current in said electron beam, generating an electron current signal indicating said electron current, and using the ratio of said flux signal to said electron current signal to monitor said positive ion effects.

* * * * *